United States Patent
Nagai

(10) Patent No.: US 8,786,014 B2
(45) Date of Patent: Jul. 22, 2014

(54) VERTICAL CHANNEL TRANSISTOR ARRAY AND MANUFACTURING METHOD THEREOF

(75) Inventor: Yukihiro Nagai, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 225 days.

(21) Appl. No.: 13/008,024

(22) Filed: Jan. 18, 2011

(65) Prior Publication Data
US 2012/0181606 A1    Jul. 19, 2012

(51) Int. Cl.
*H01L 29/78* (2006.01)

(52) U.S. Cl.
USPC .... 257/334; 257/331; 257/332; 257/E21.657; 257/E2.6581; 257/E21.659

(58) Field of Classification Search
None
See application file for complete search history.

(56) References Cited

U.S. PATENT DOCUMENTS

| | | | |
|---|---|---|---|
| 6,348,374 B1 | 2/2002 | Athavale et al. | |
| 6,426,526 B1 | 7/2002 | Divakaruni et al. | |
| 6,624,033 B2 | 9/2003 | Noble | |
| 7,355,230 B2 | 4/2008 | Thies et al. | |
| 2002/0030214 A1 | 3/2002 | Horiguchi | |
| 2006/0113587 A1* | 6/2006 | Thies et al. | 257/328 |
| 2009/0302380 A1 | 12/2009 | Graf et al. | |

* cited by examiner

*Primary Examiner* — Matthew W Such
*Assistant Examiner* — Abul Kalam
(74) *Attorney, Agent, or Firm* — Jianq Chyun IP Office

(57) ABSTRACT

A vertical channel transistor array includes a plurality of embedded bit lines, a plurality of bit line contacts, a plurality of embedded word lines, and a current leakage isolation structure. An active area of a vertical channel transistor is defined by the semiconductor pillars. The embedded bit lines are disposed in parallel in a semiconductor substrate and extended in a column direction. Each of the bit line contacts is respectively disposed at a side of one of the embedded bit lines. The embedded word lines are disposed in parallel above the embedded bit lines and extended in a row direction. Besides, the embedded word lines and the semiconductor pillars in the same row are connected but spaced by a gate dielectric layer. The current leakage isolation structure is disposed at ends of the embedded bit lines to prevent current leakage between the adjacent bit line contacts.

9 Claims, 47 Drawing Sheets

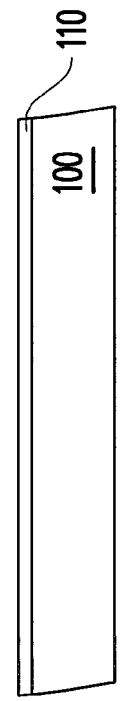
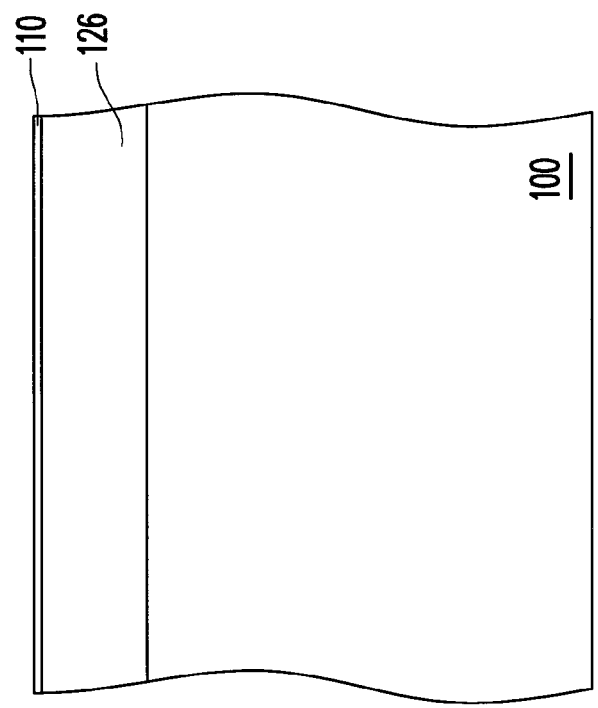
FIG. 2A(1)
FIG. 2A(2)

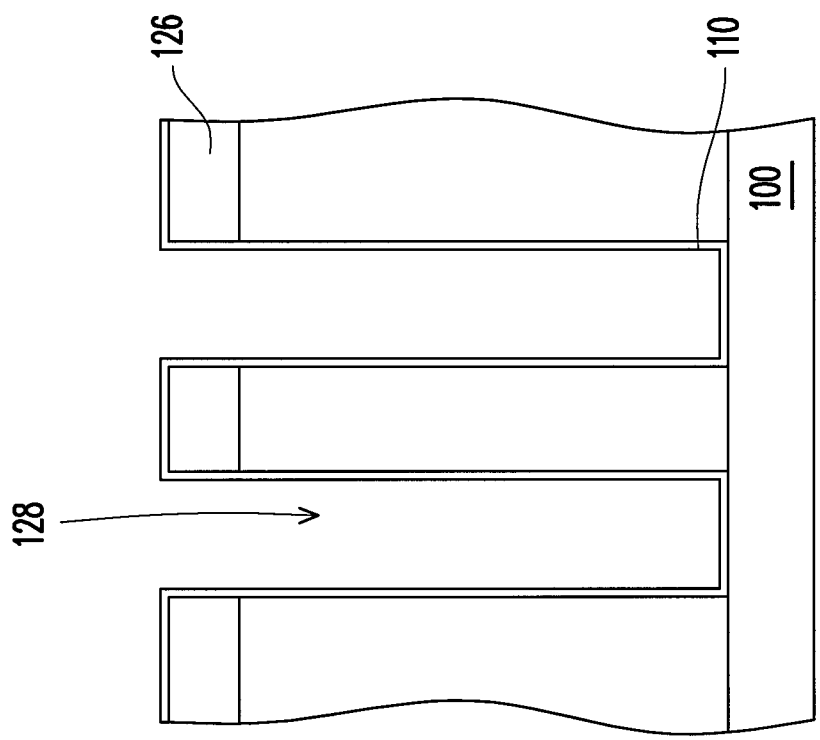
FIG. 2A(3)

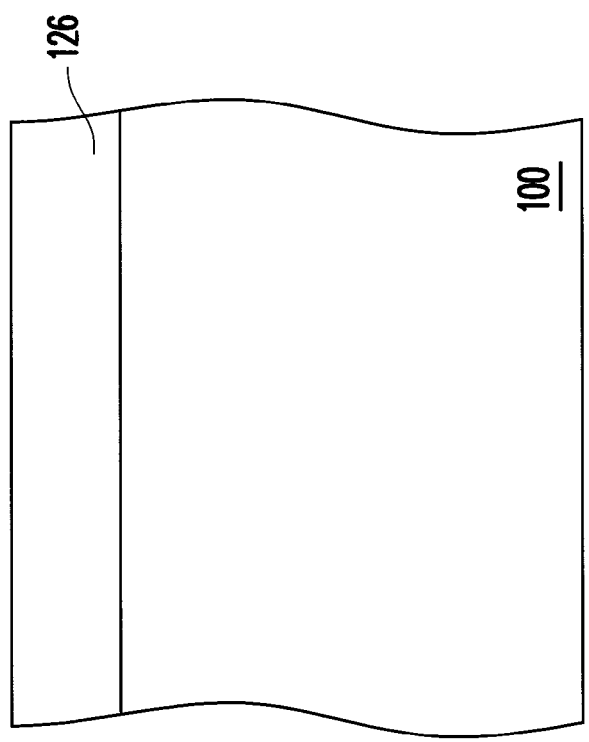
FIG. 2B(1)
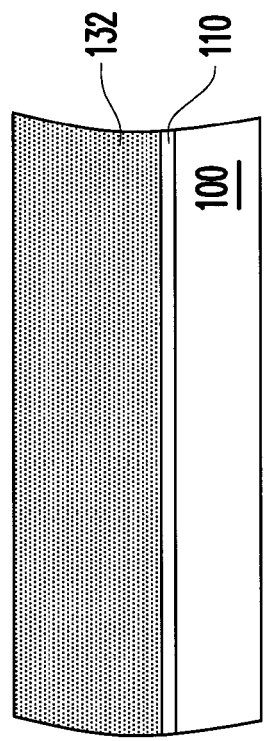
FIG. 2B(2)

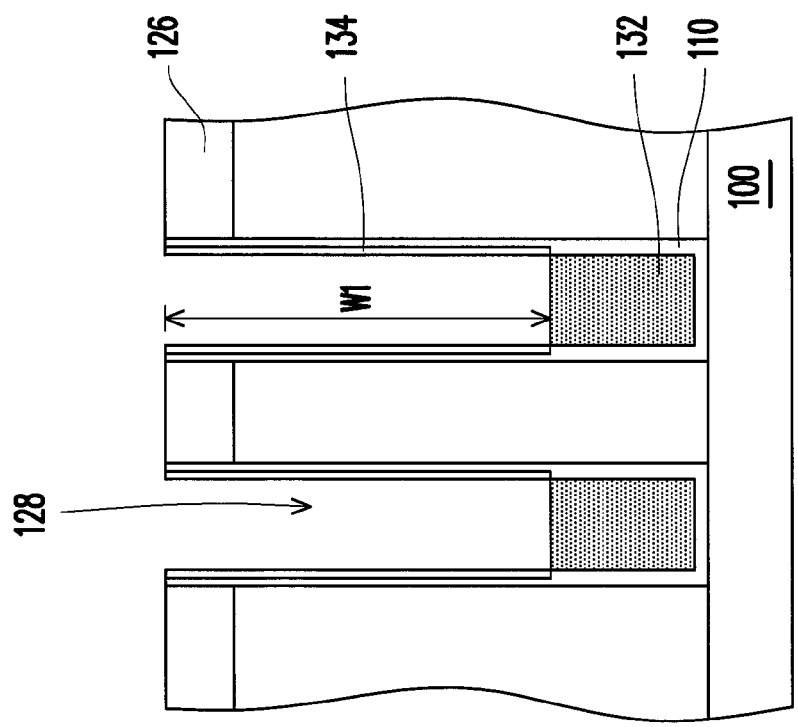
FIG. 2B(3)

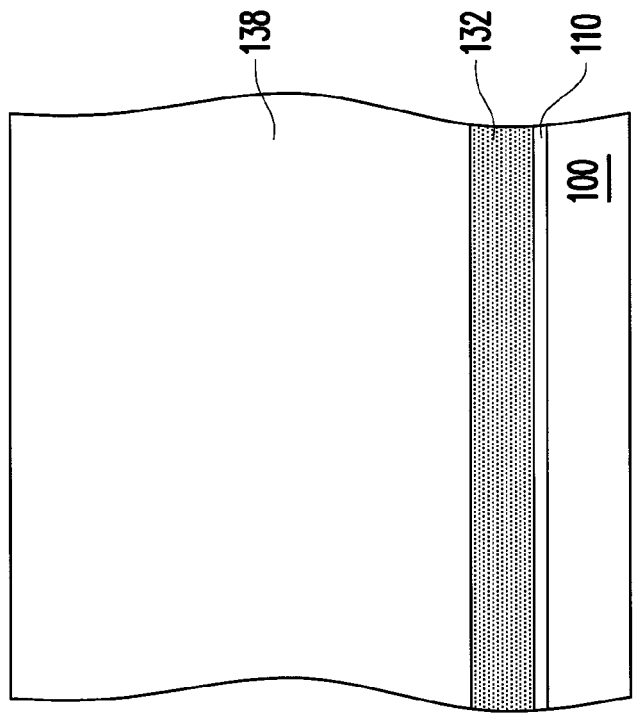
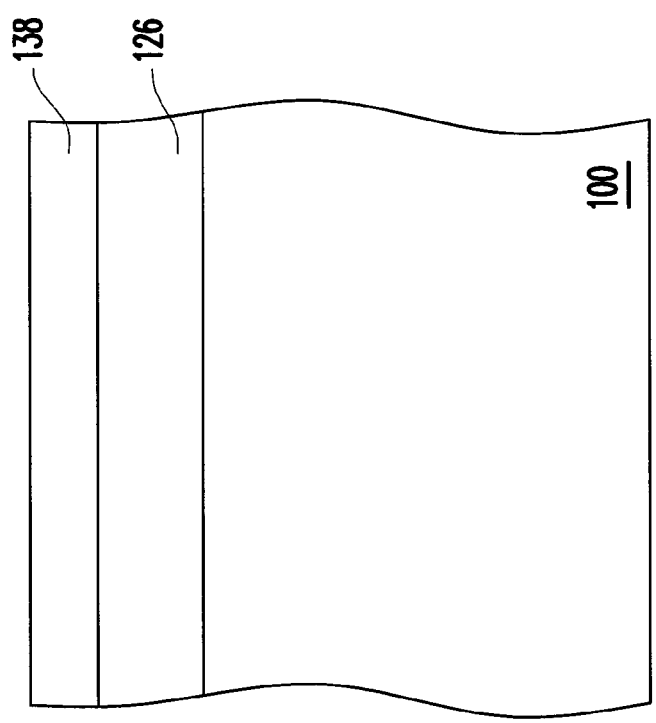
FIG. 2C(2)
FIG. 2C(1)

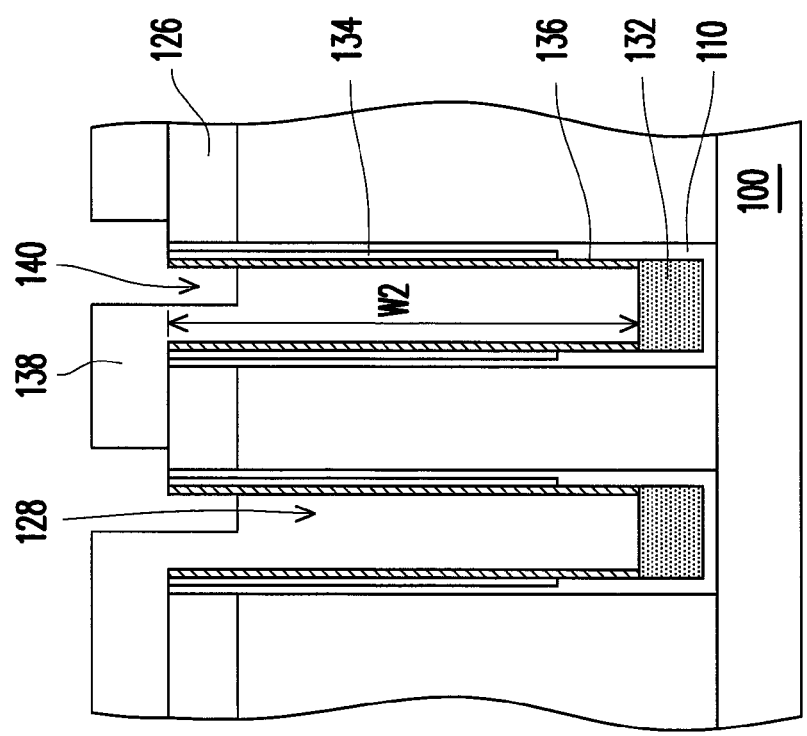
FIG. 2C(3)

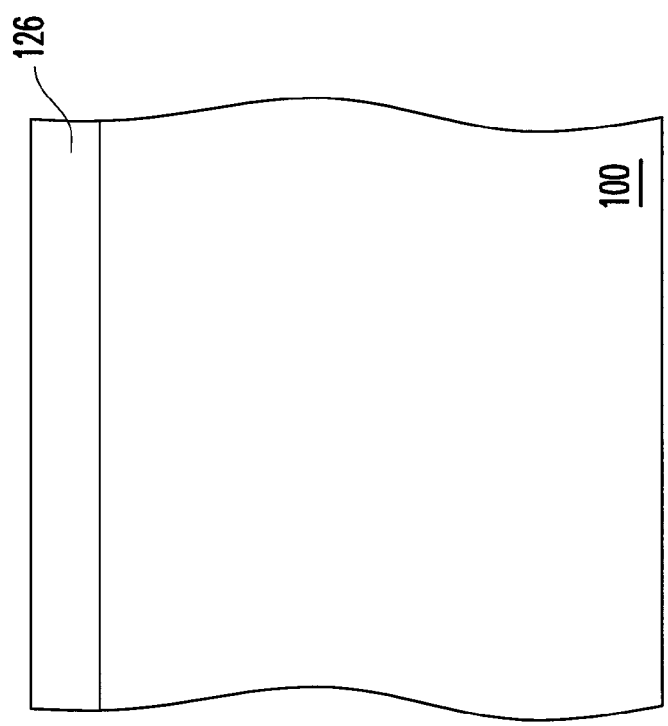
FIG. 2D(1)
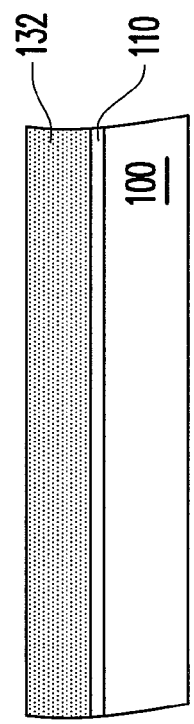
FIG. 2D(2)

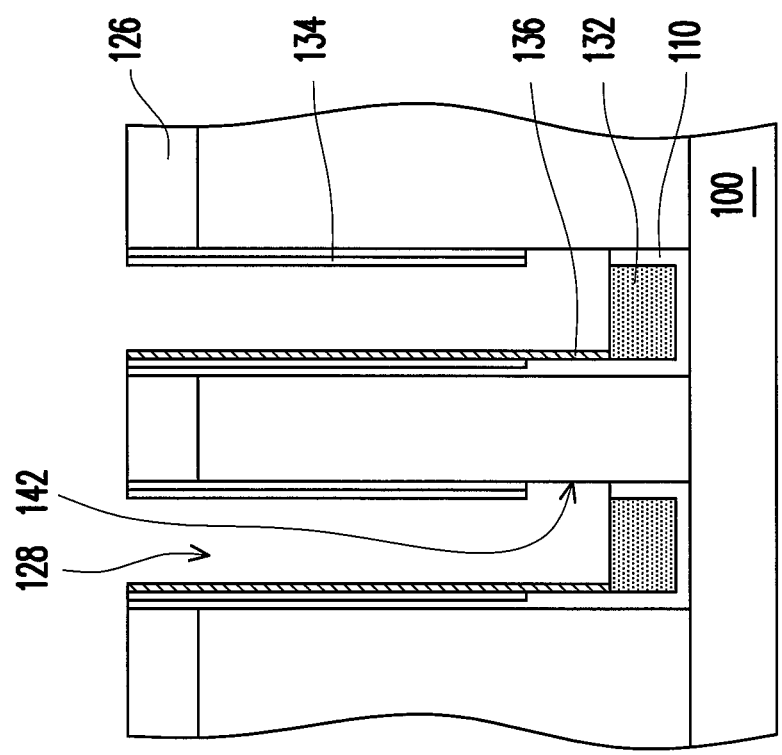
FIG. 2D(3)

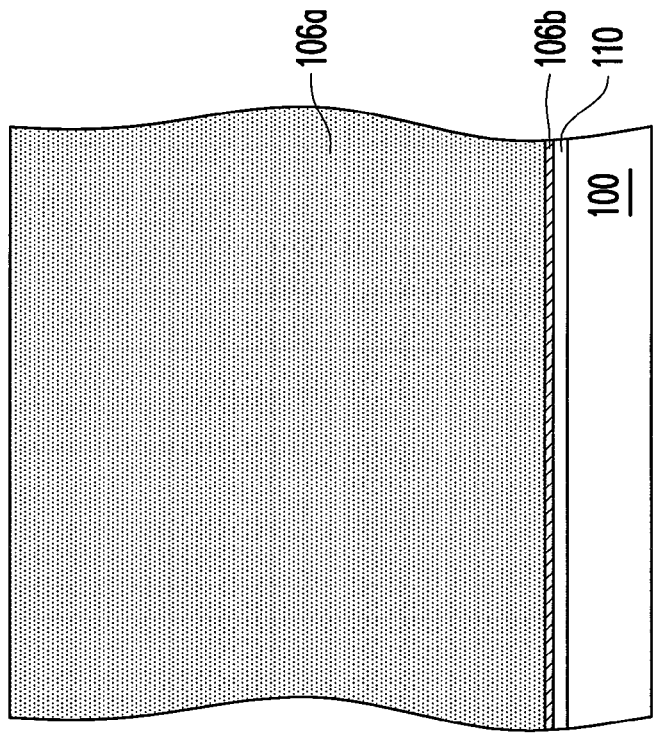
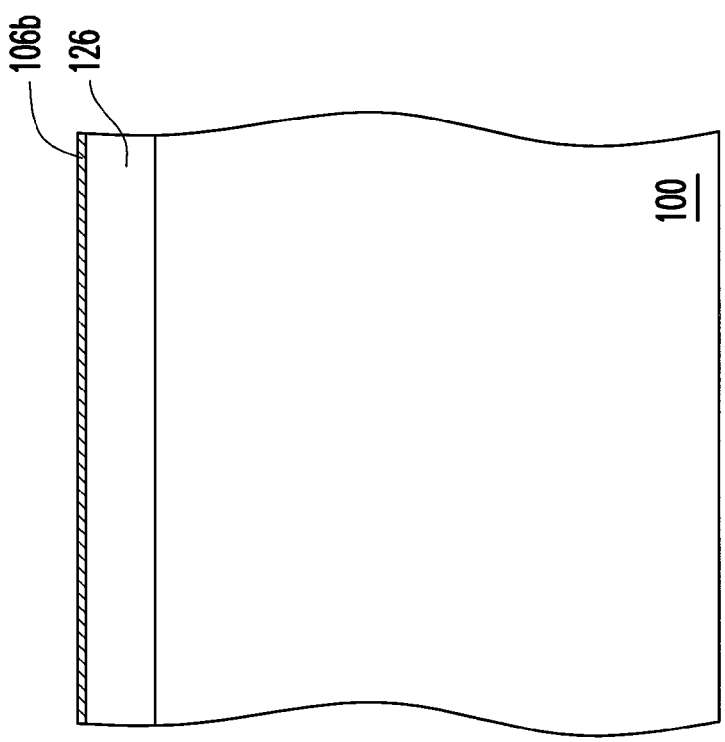
FIG. 2E(2)
FIG. 2E(1)

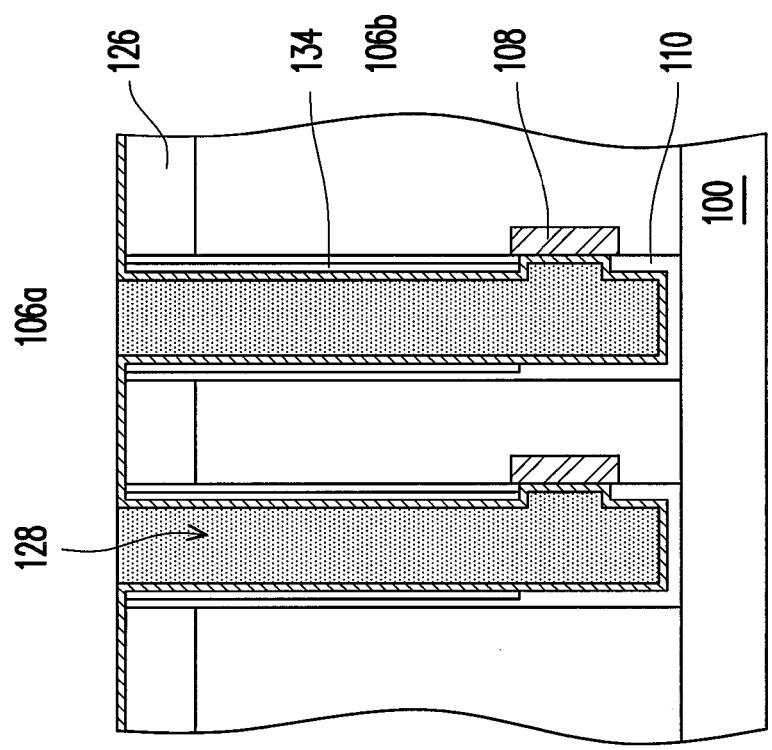
FIG. 2E(3)

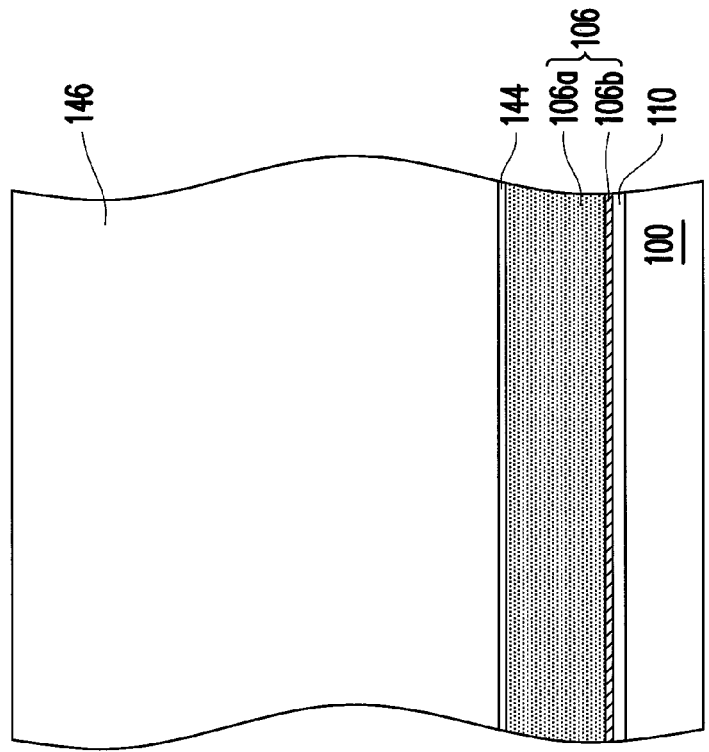
FIG. 2F(2)
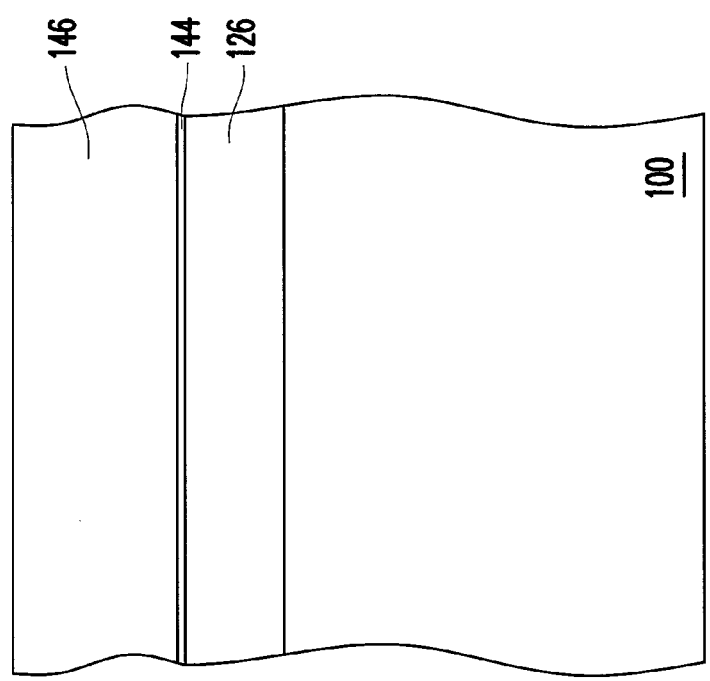
FIG. 2F(1)

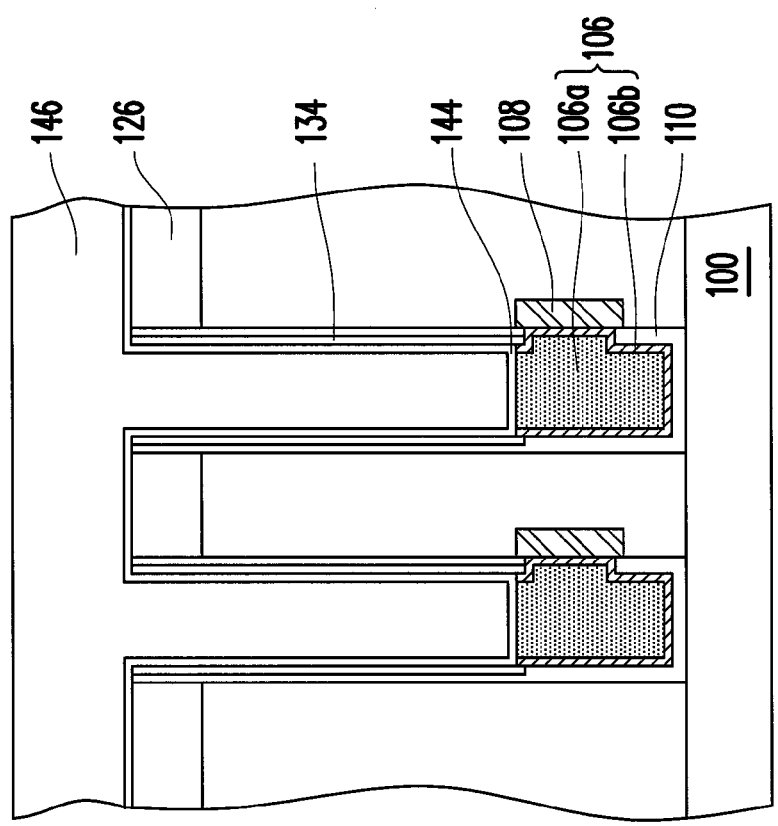
FIG. 2F(3)

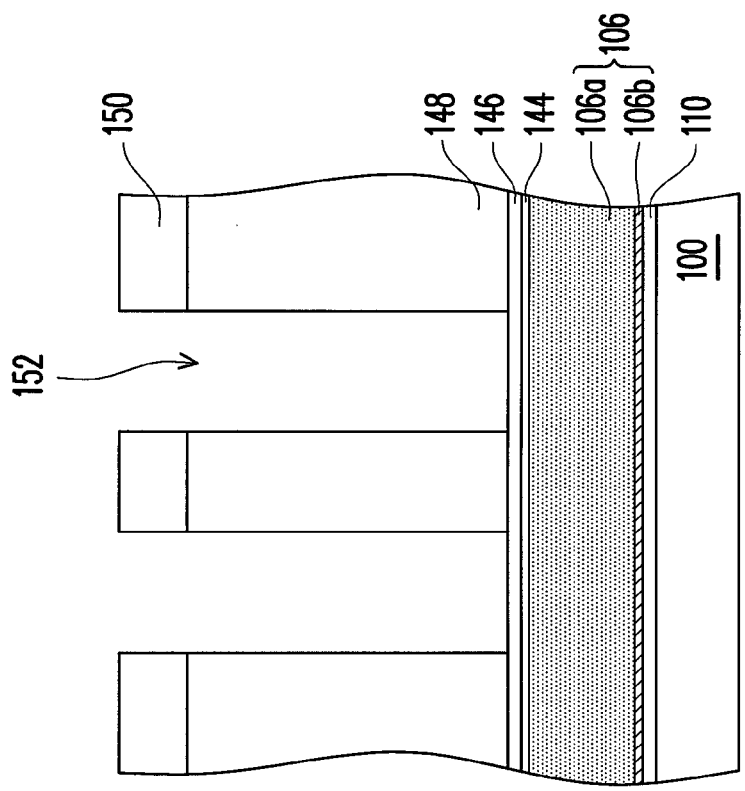
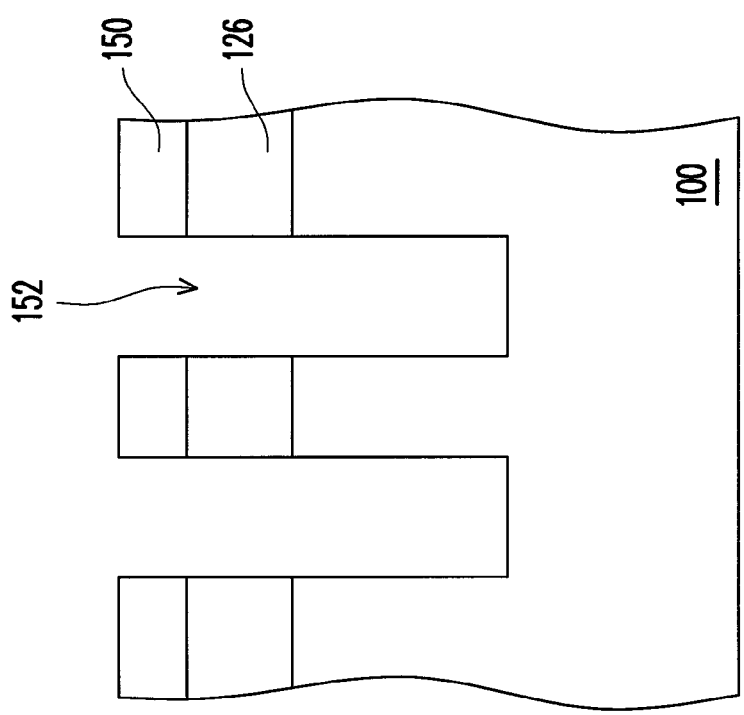
FIG. 2G(2)
FIG. 2G(1)

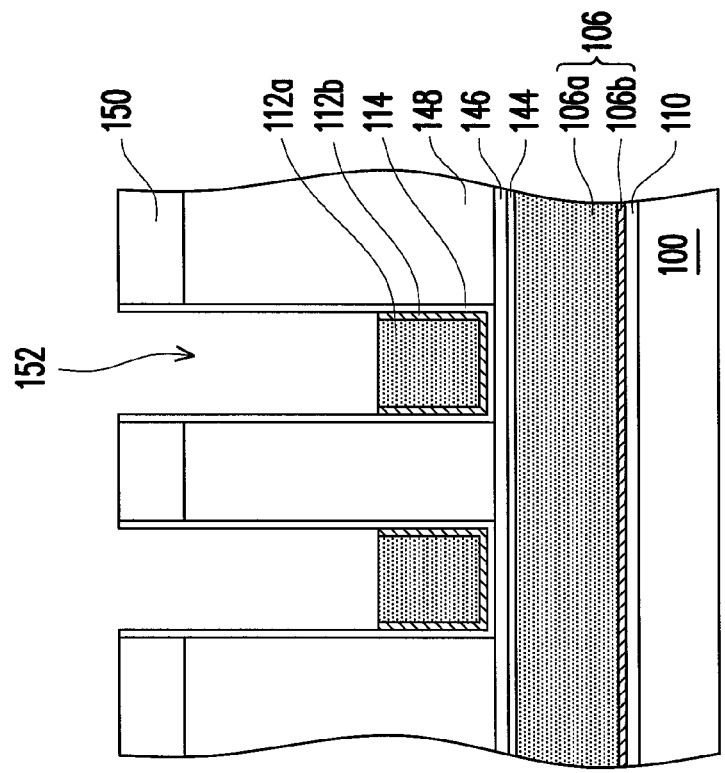
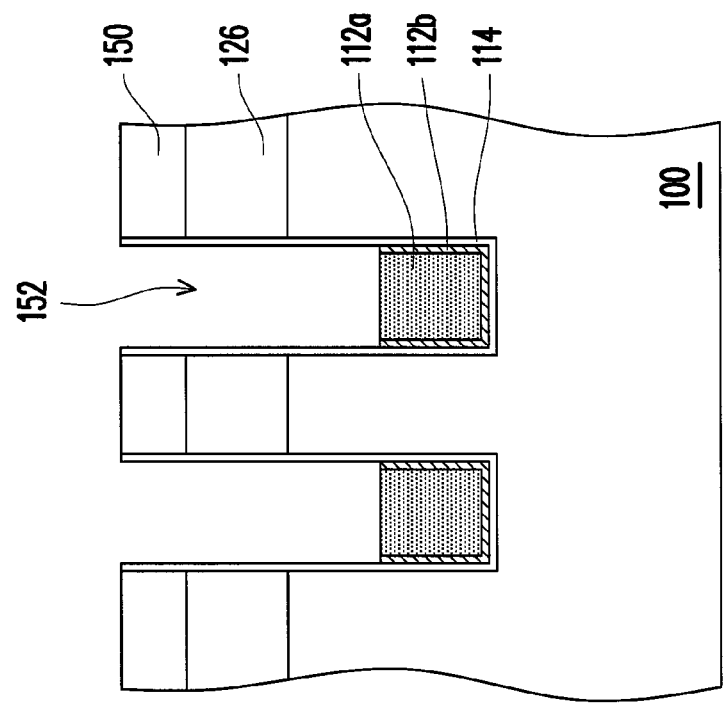
FIG. 2H(2)
FIG. 2H(1)

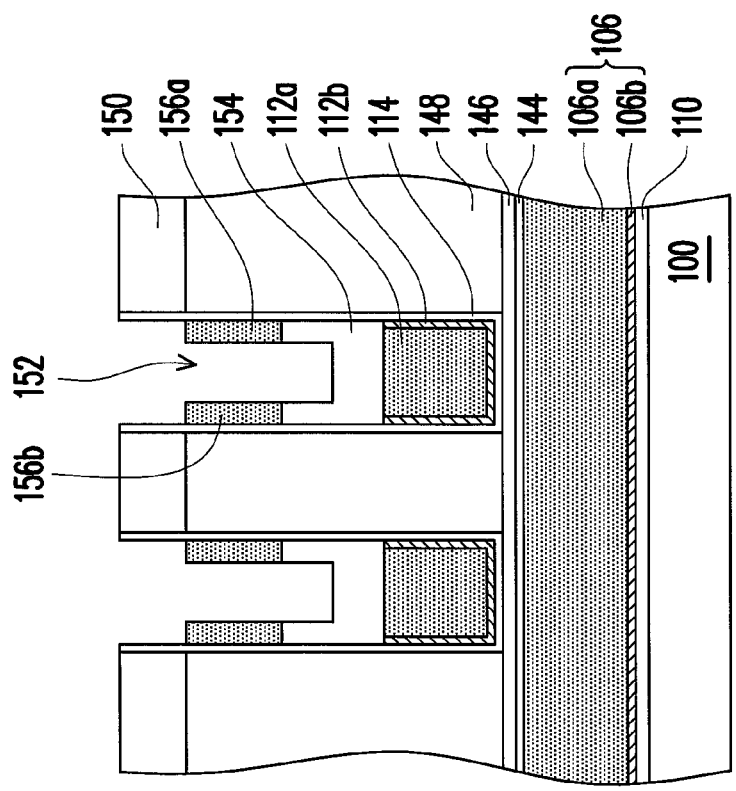
FIG. 2I(1)
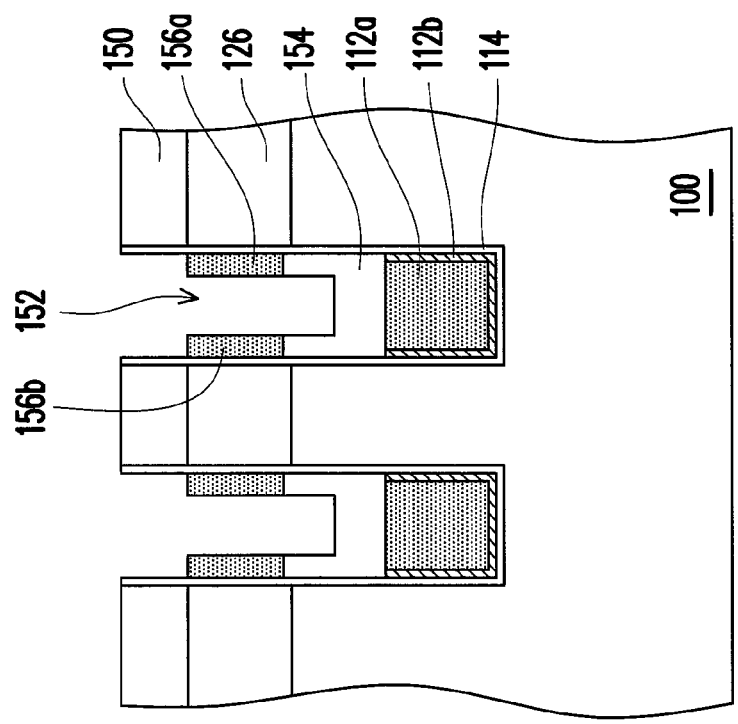
FIG. 2I(2)

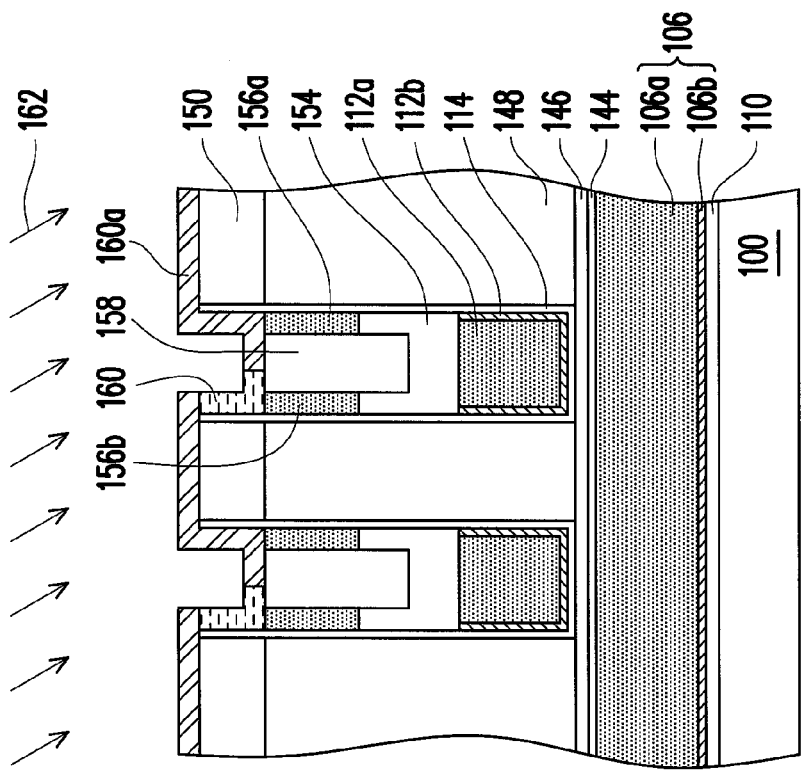
FIG. 2J(2)
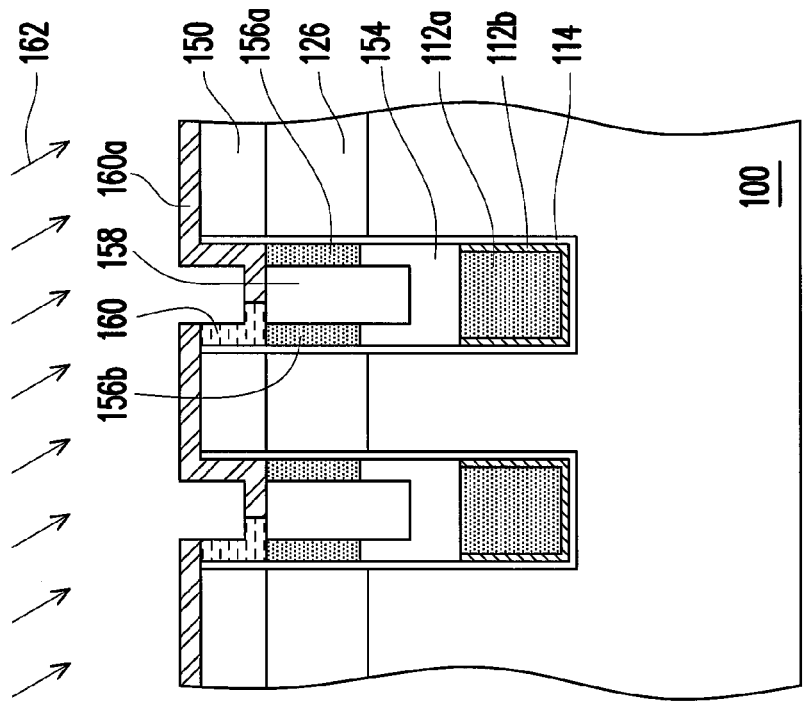
FIG. 2J(1)

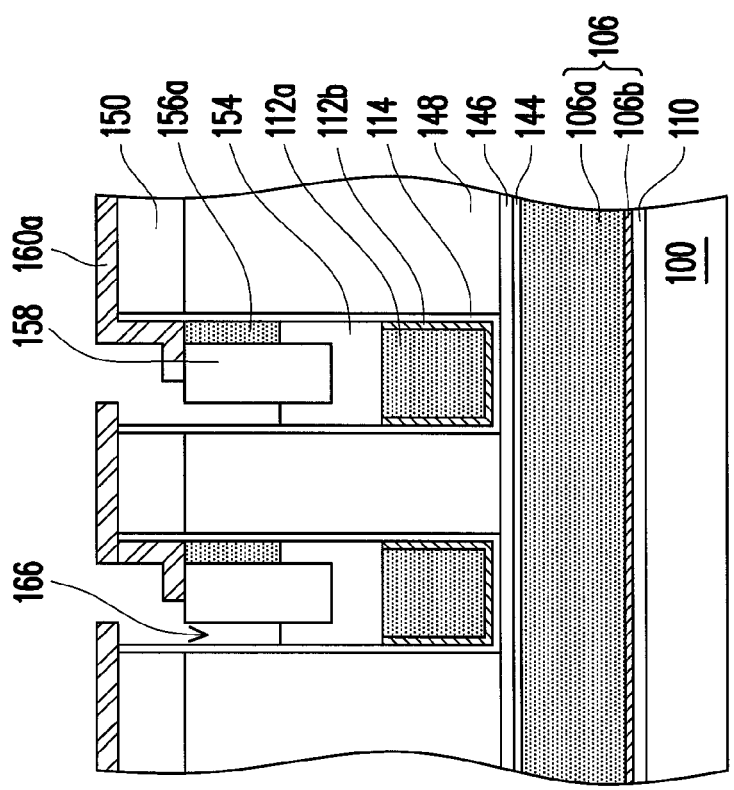
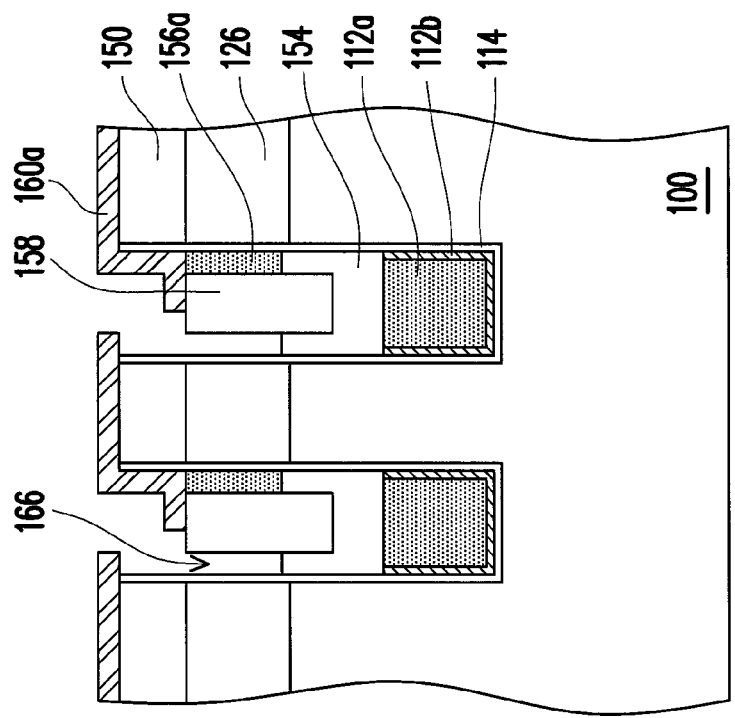
FIG. 2K(2)
FIG. 2K(1)

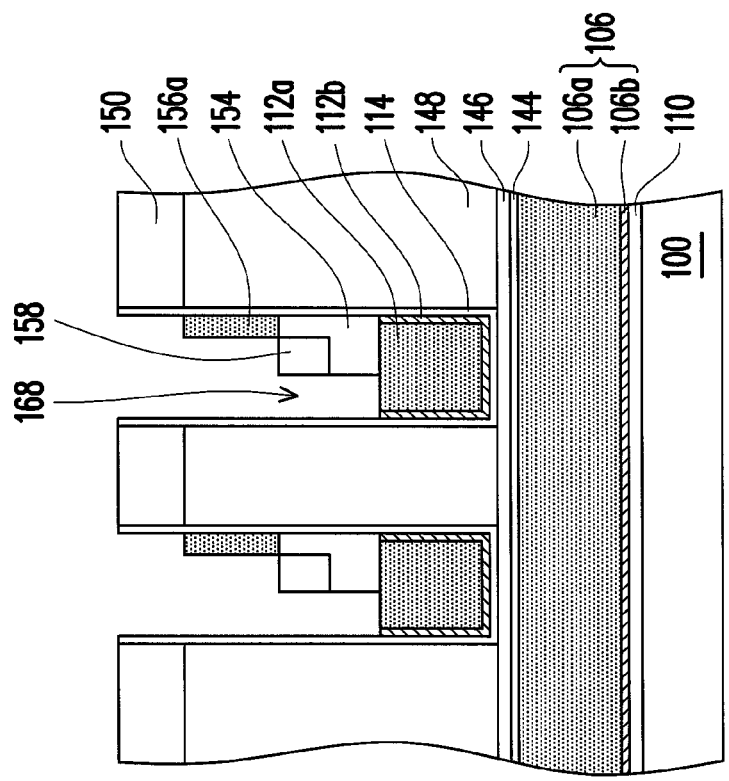
FIG. 2L(1)
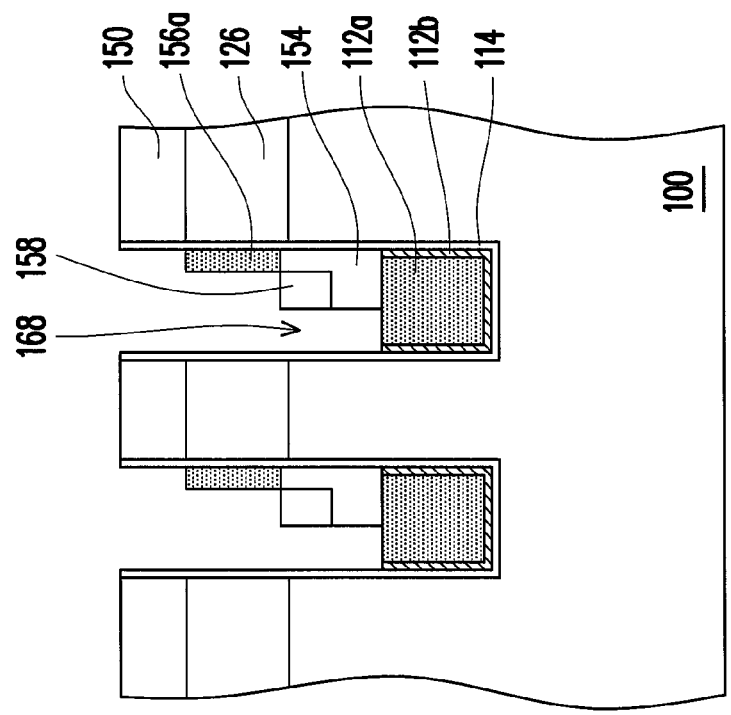
FIG. 2L(2)

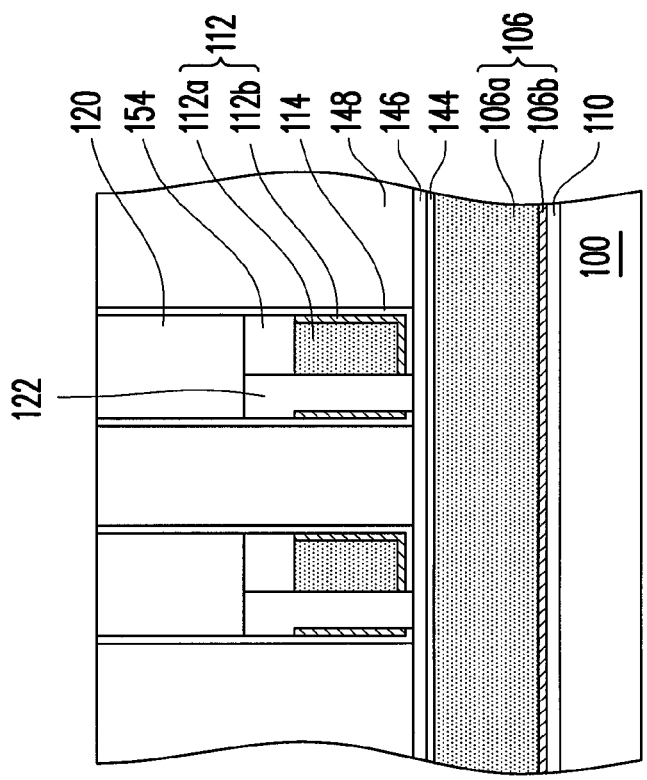
FIG. 2M(1)
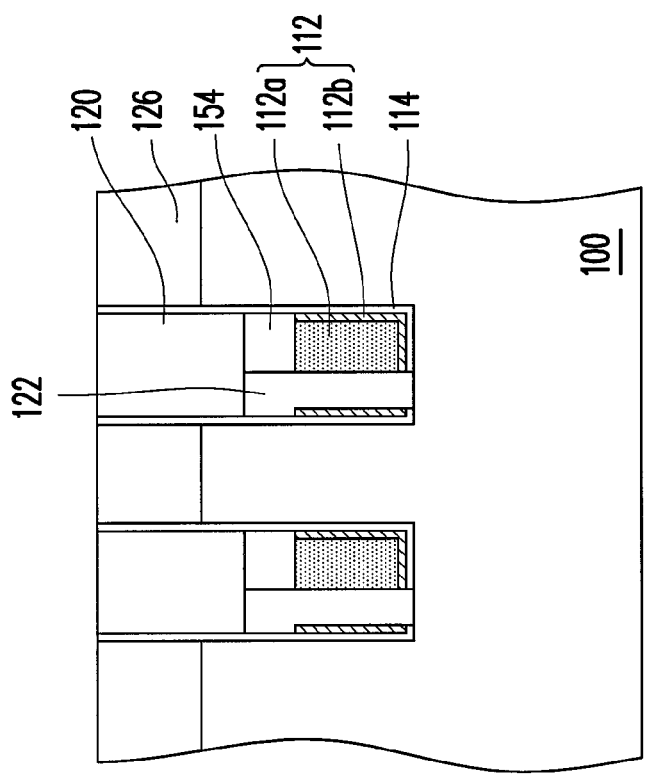
FIG. 2M(2)

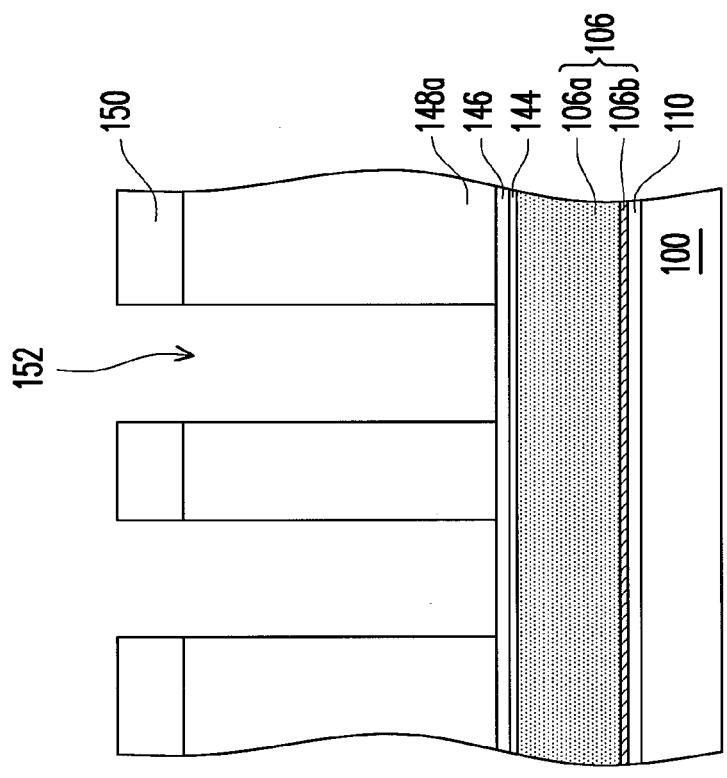
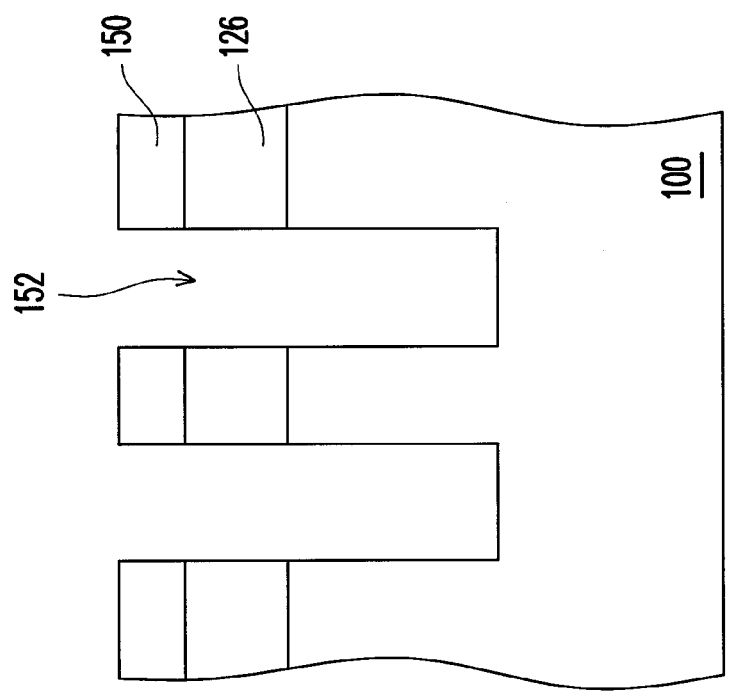
FIG. 4A(2)
FIG. 4A(1)

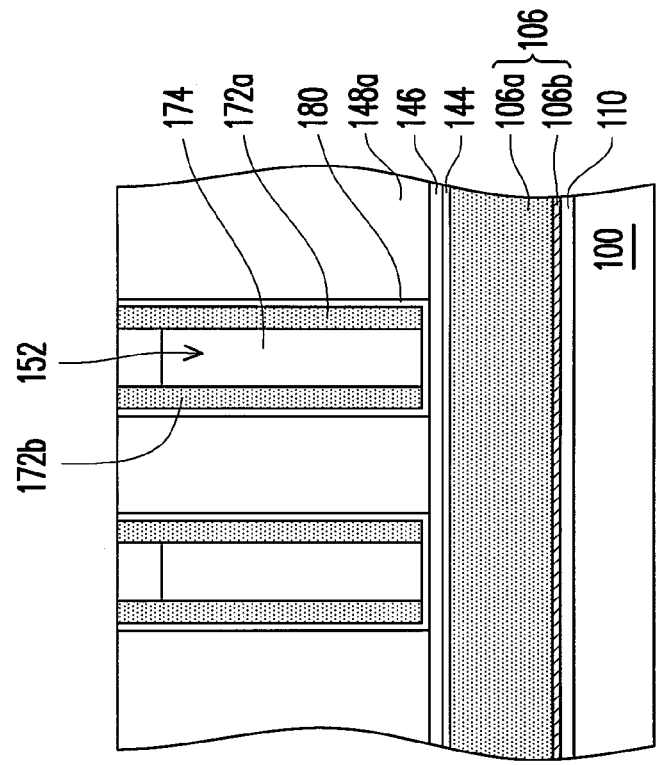
FIG. 4B(2)
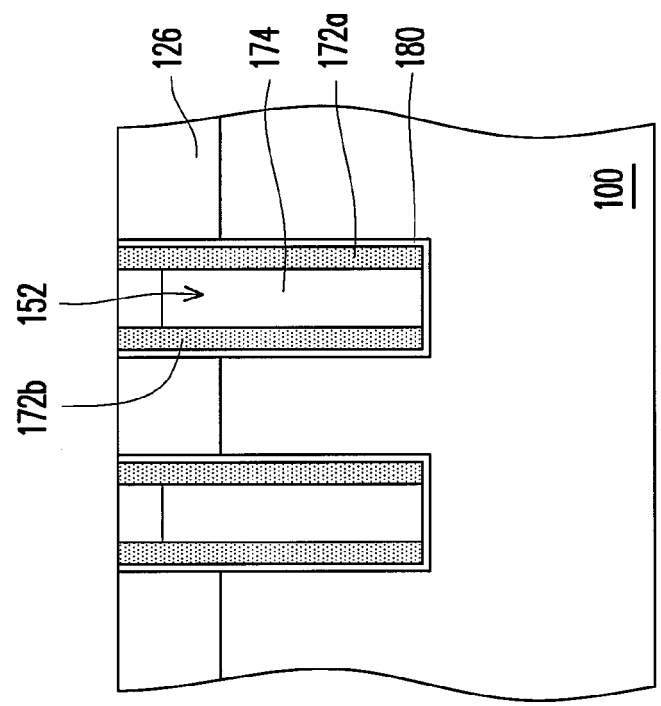
FIG. 4B(1)

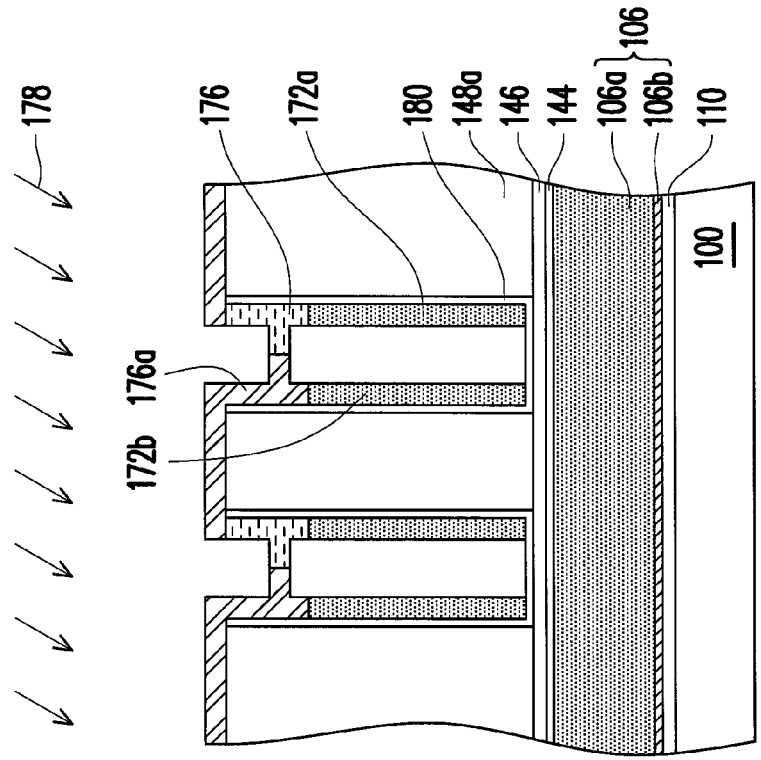
FIG. 4C(2)
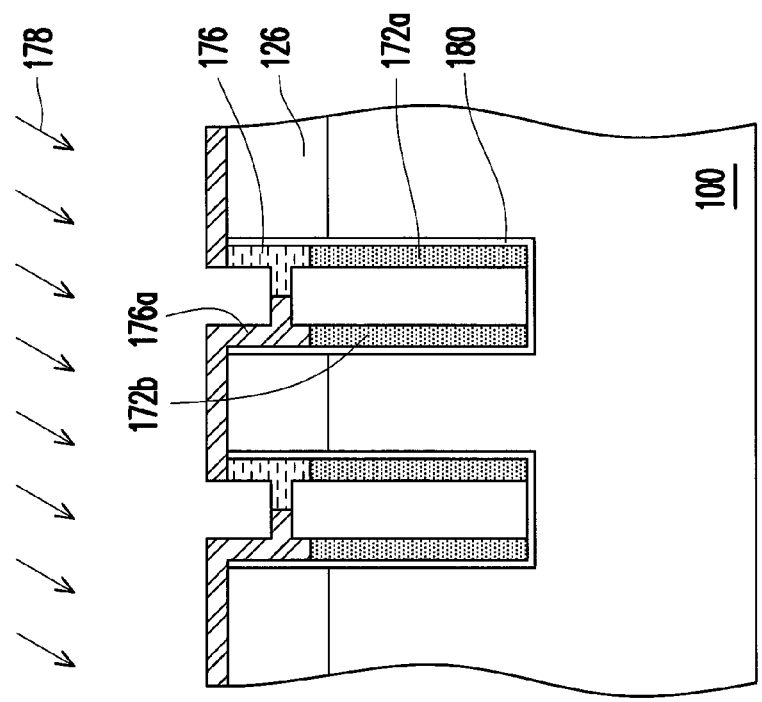
FIG. 4C(1)

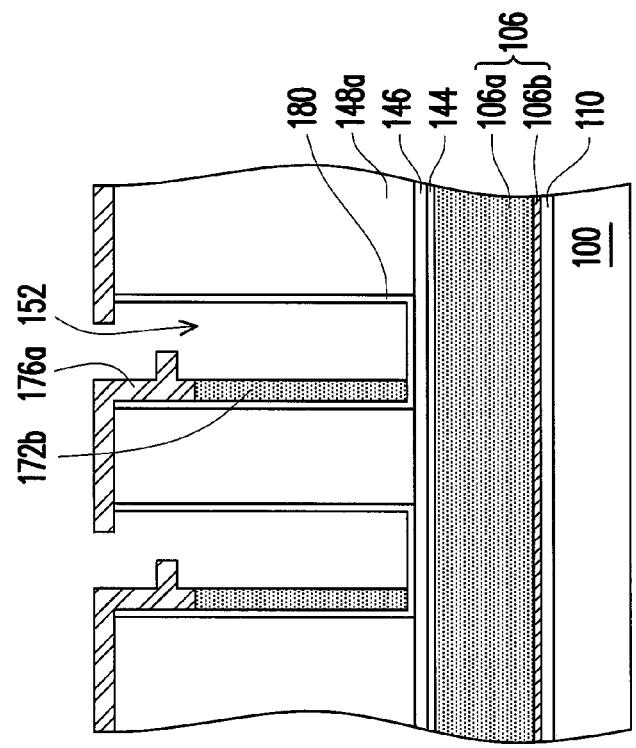
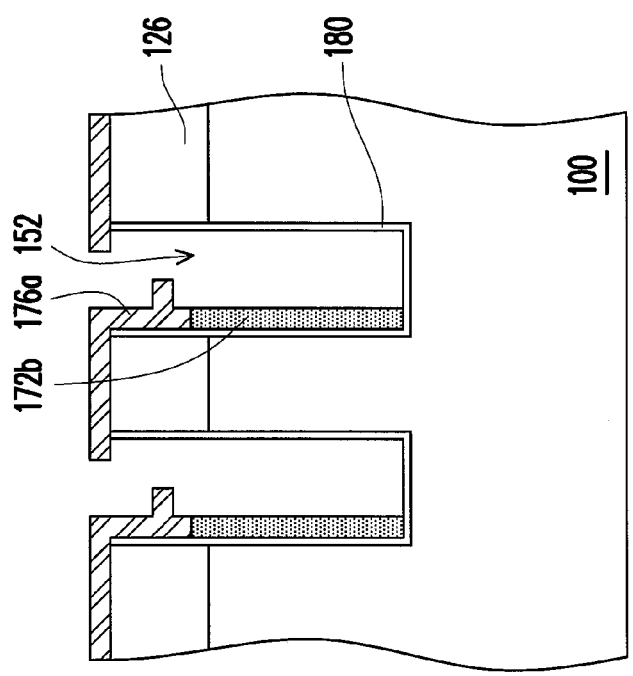
FIG. 4D(2)
FIG. 4D(1)

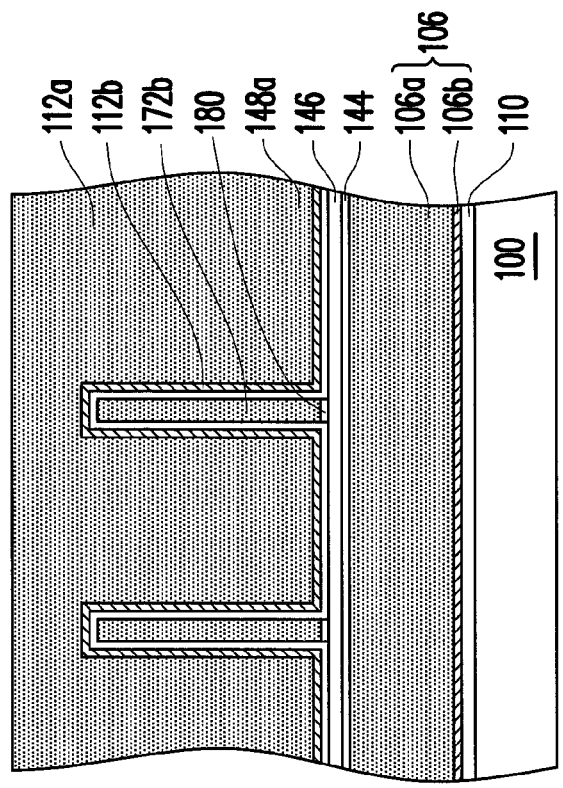
FIG. 4E(2)
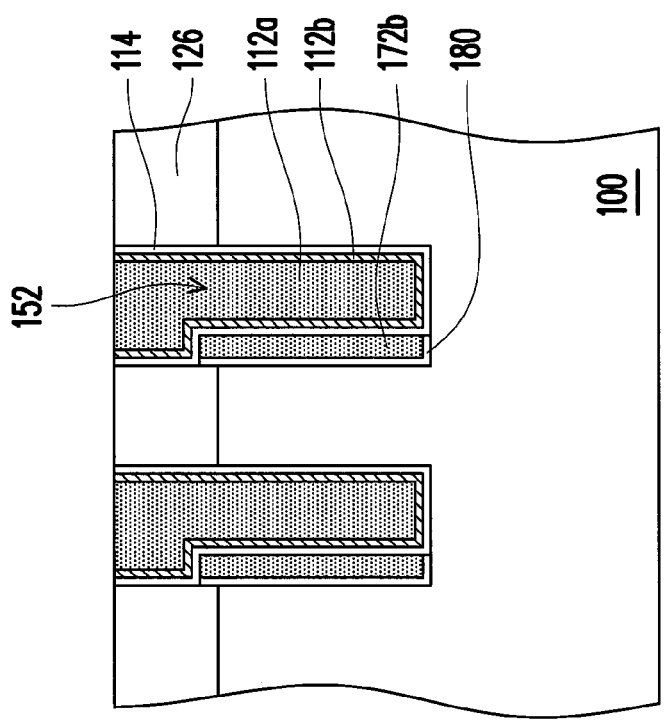
FIG. 4E(1)

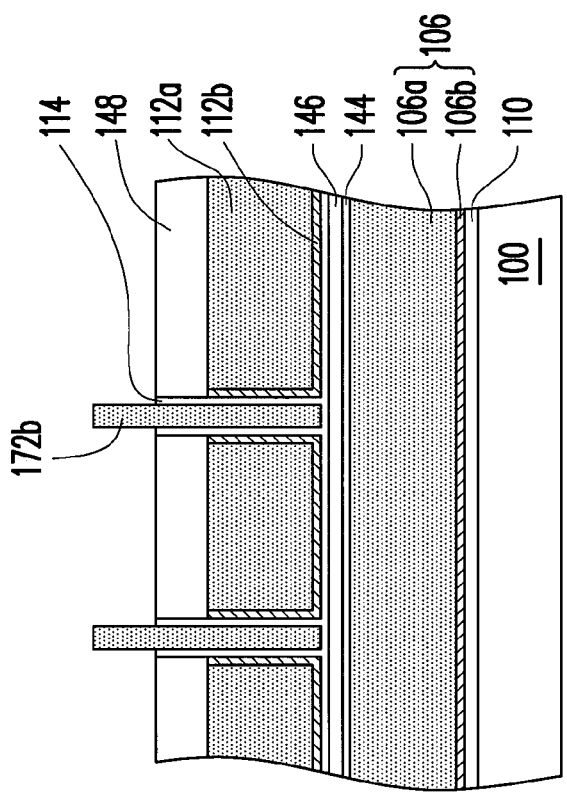
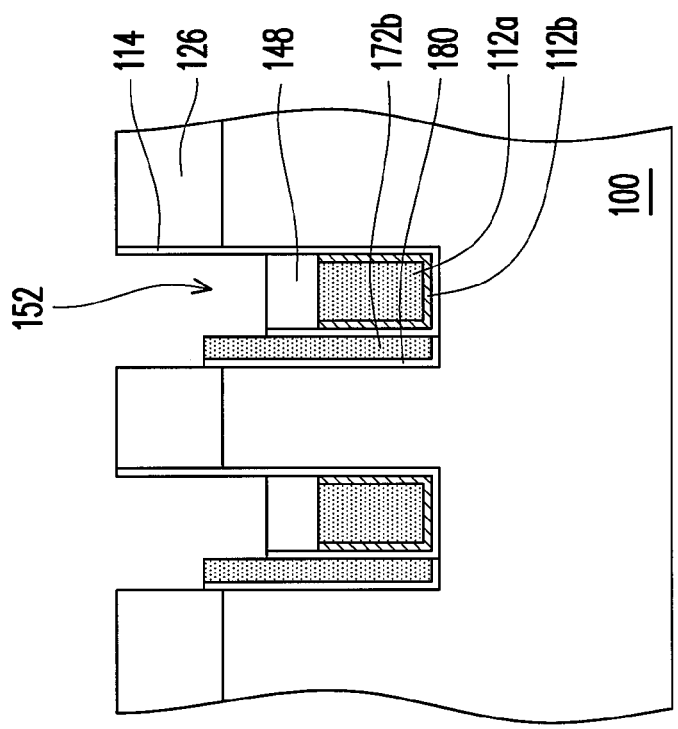
FIG. 4F(2)
FIG. 4F(1)

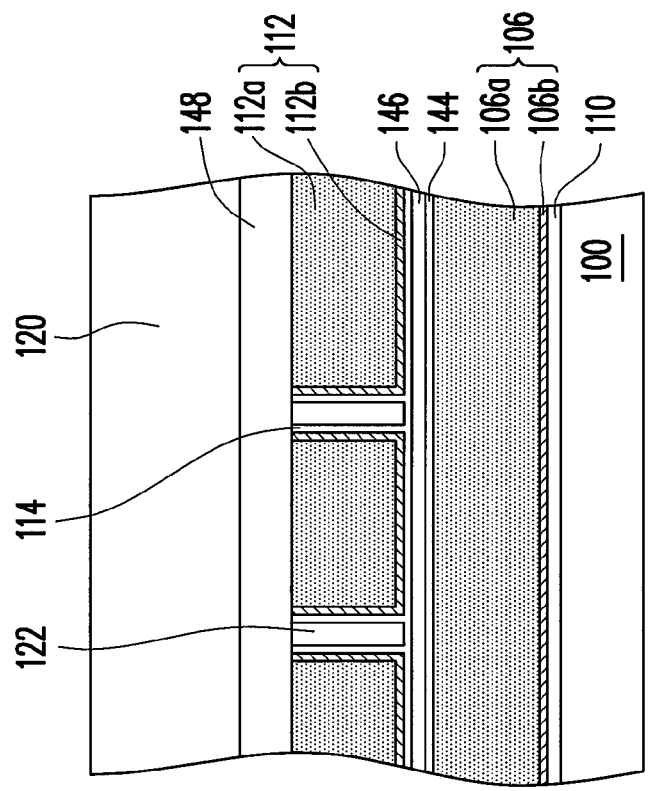
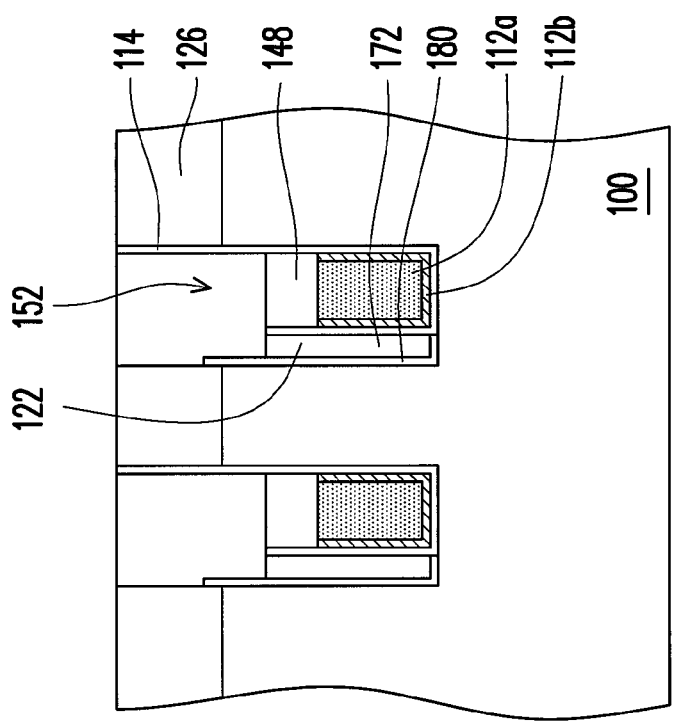
FIG. 4G(2)
FIG. 4G(1)

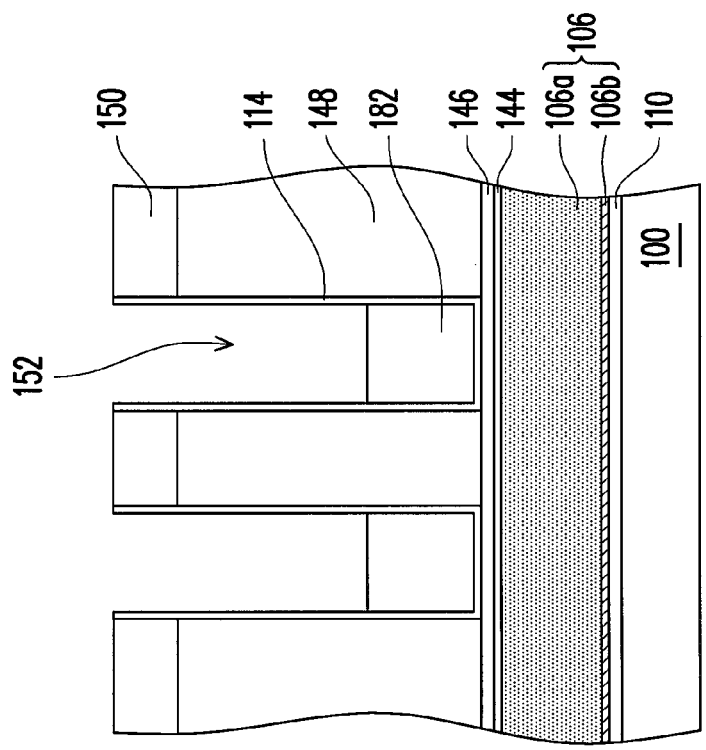
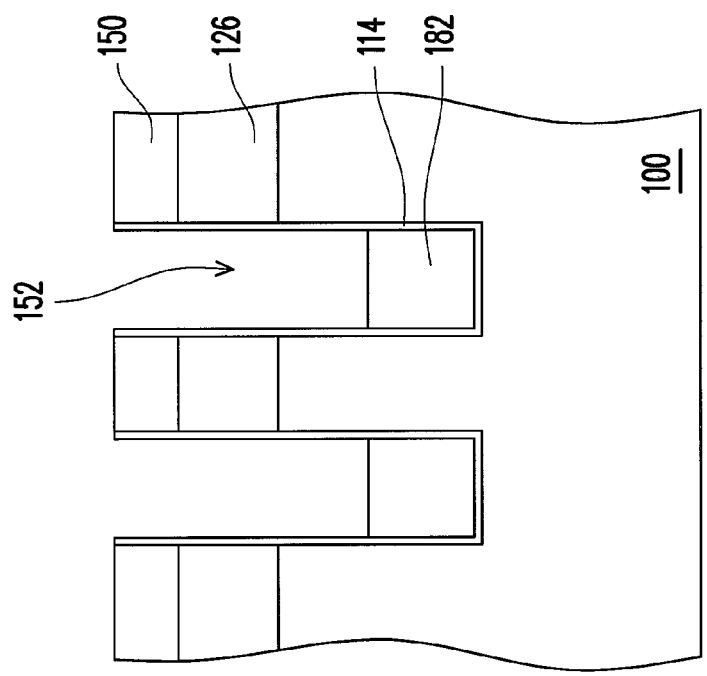
FIG. 5A(2)
FIG. 5A(1)

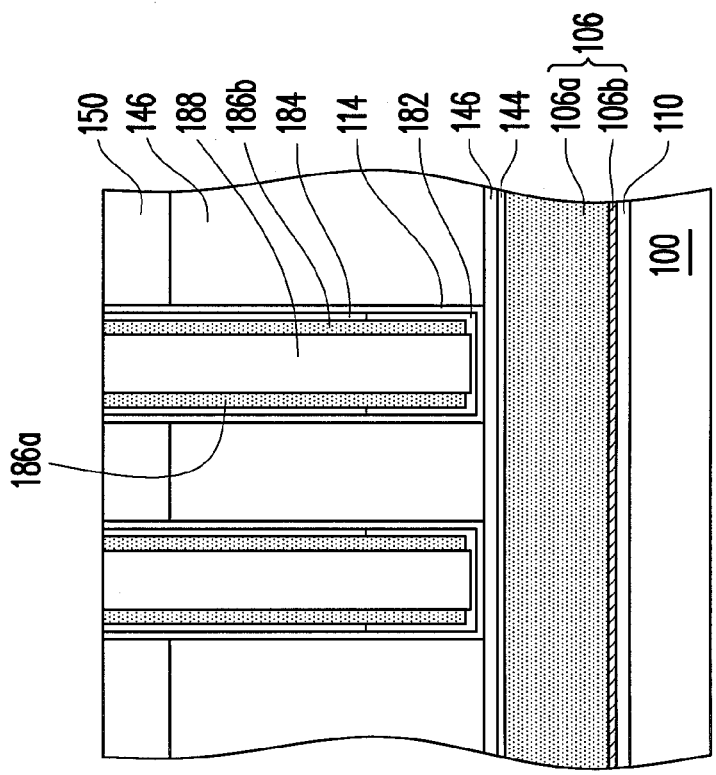
FIG. 5B(2)
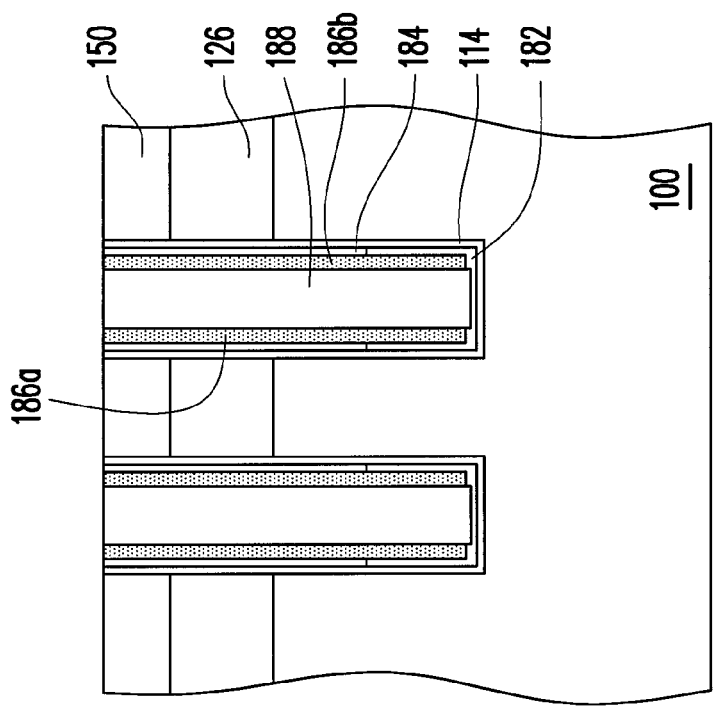
FIG. 5B(1)

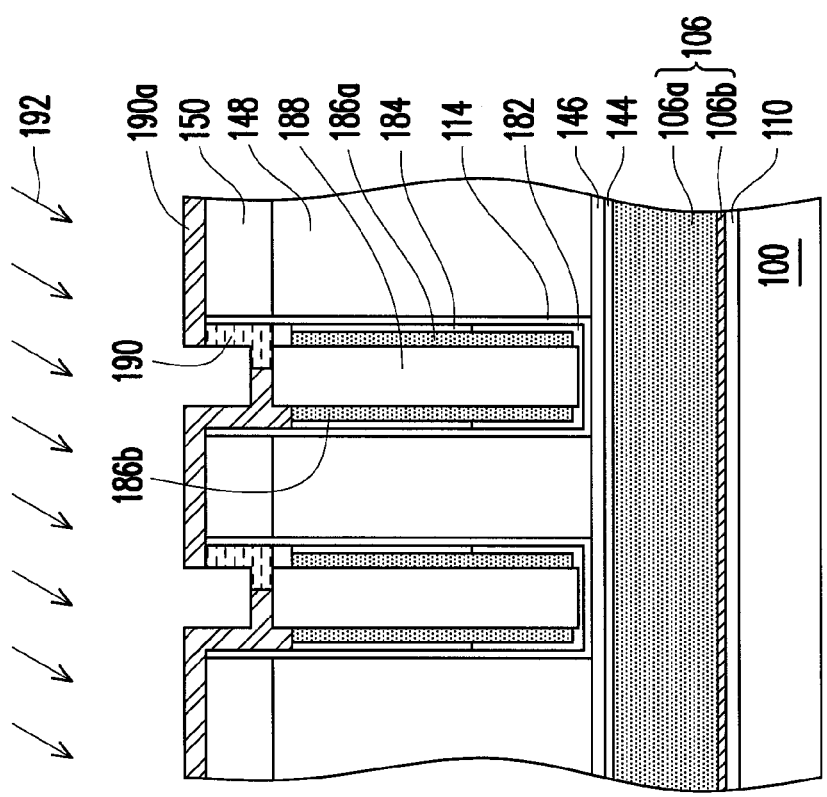
FIG. 5C(1)
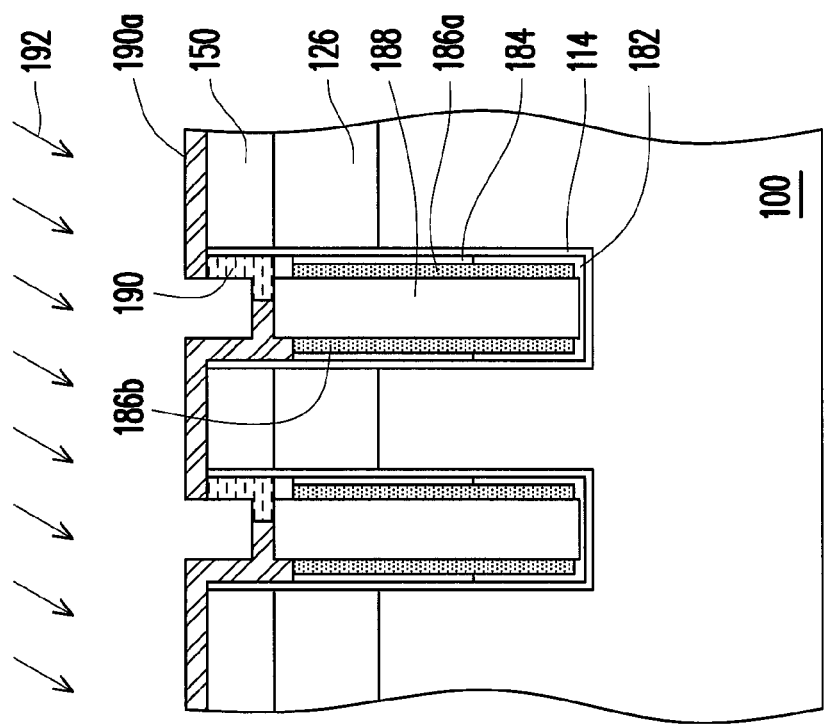
FIG. 5C(2)

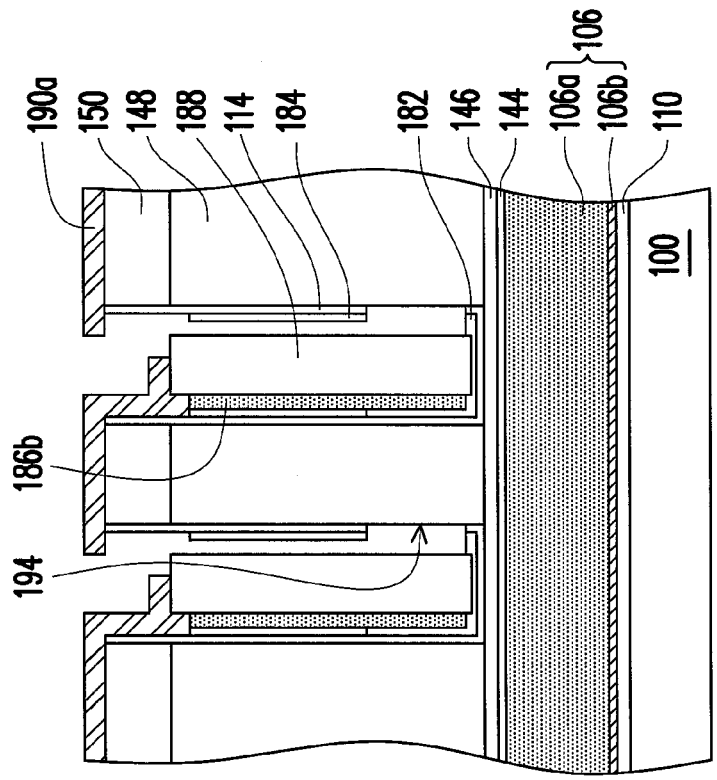
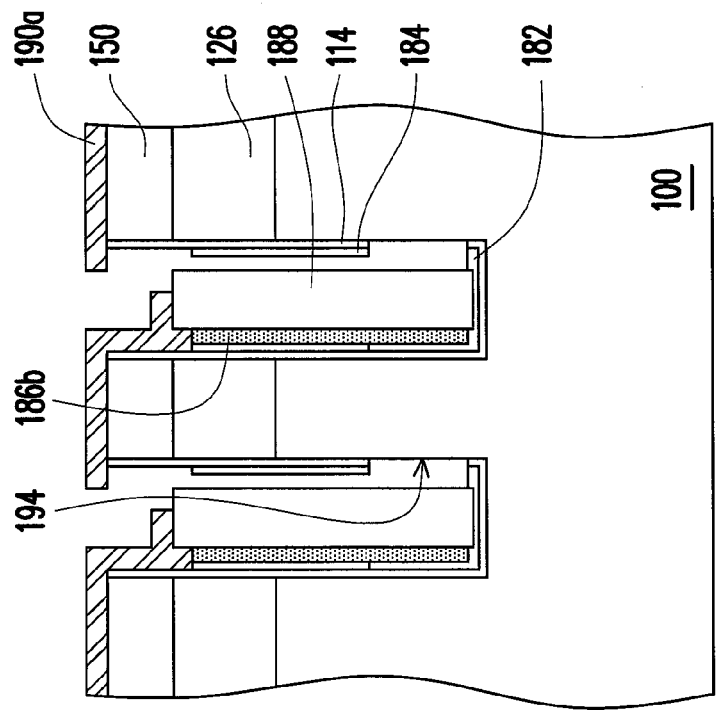
FIG. 5D(2)
FIG. 5D(1)

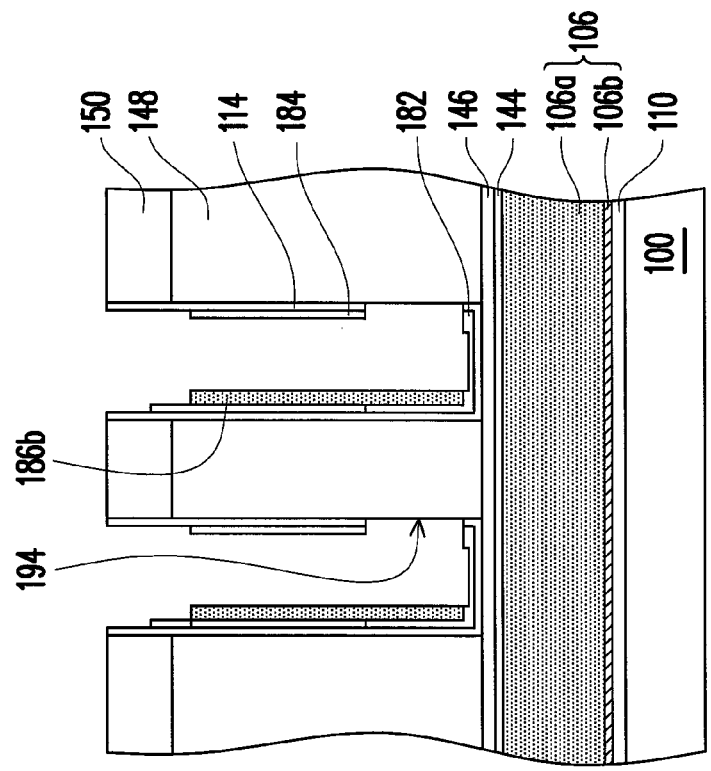
FIG. 5E(1)
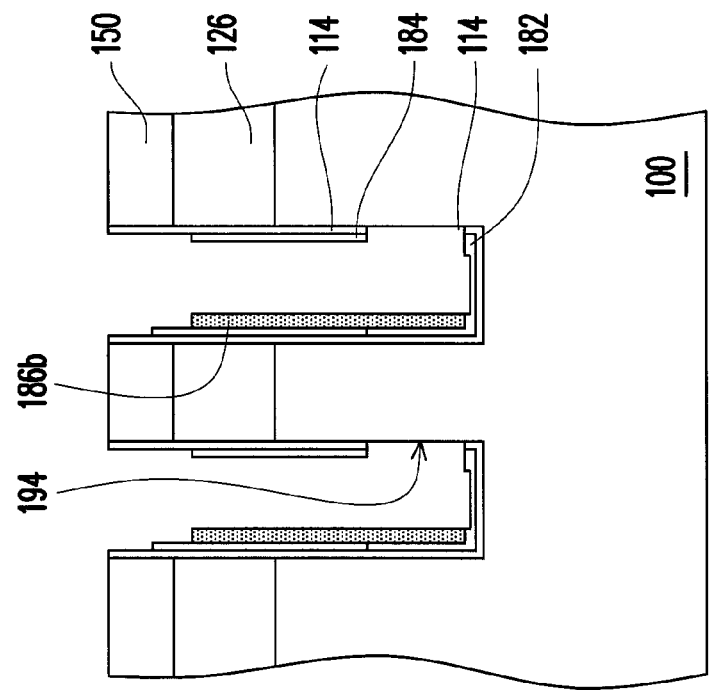
FIG. 5E(2)

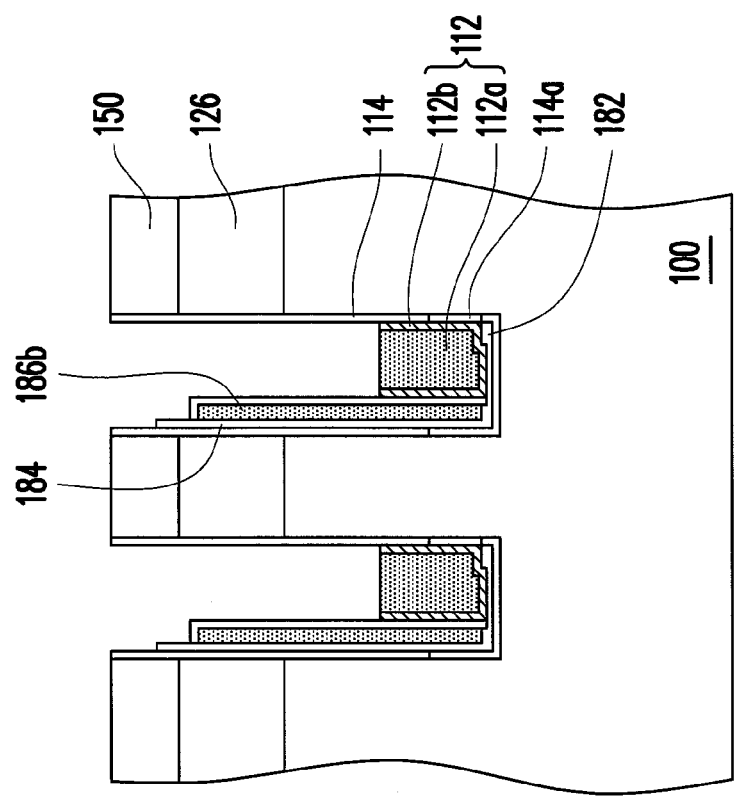
FIG. 5F(2)
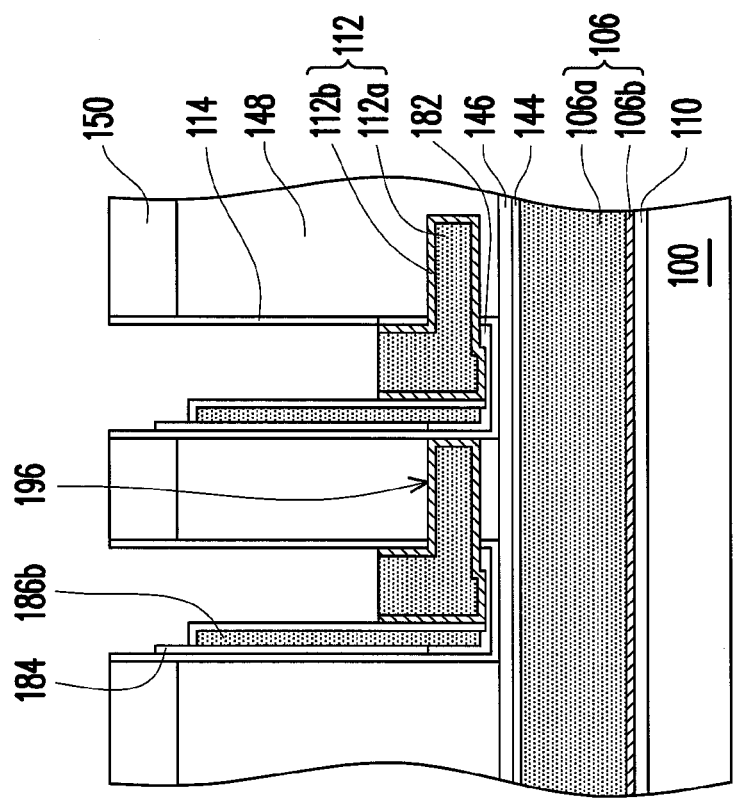
FIG. 5F(1)

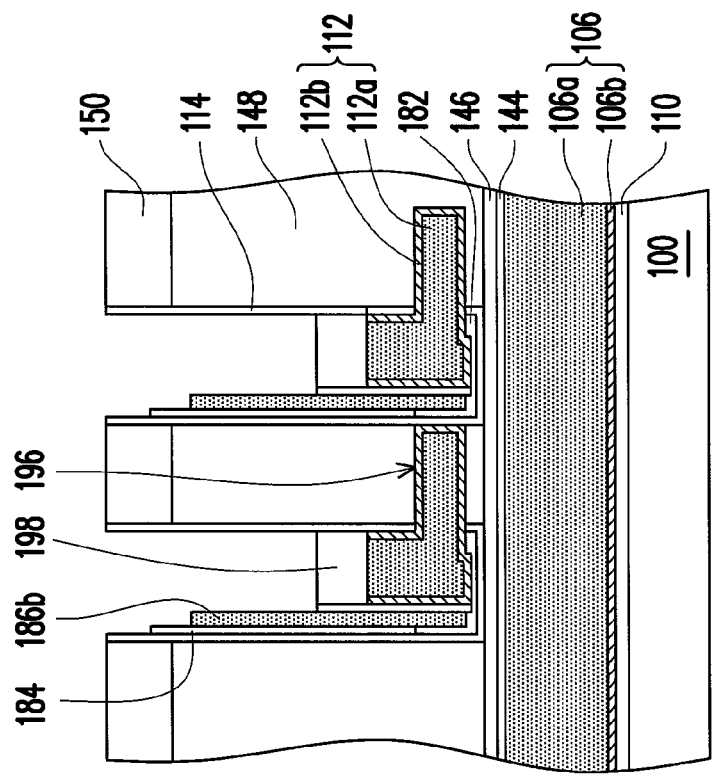
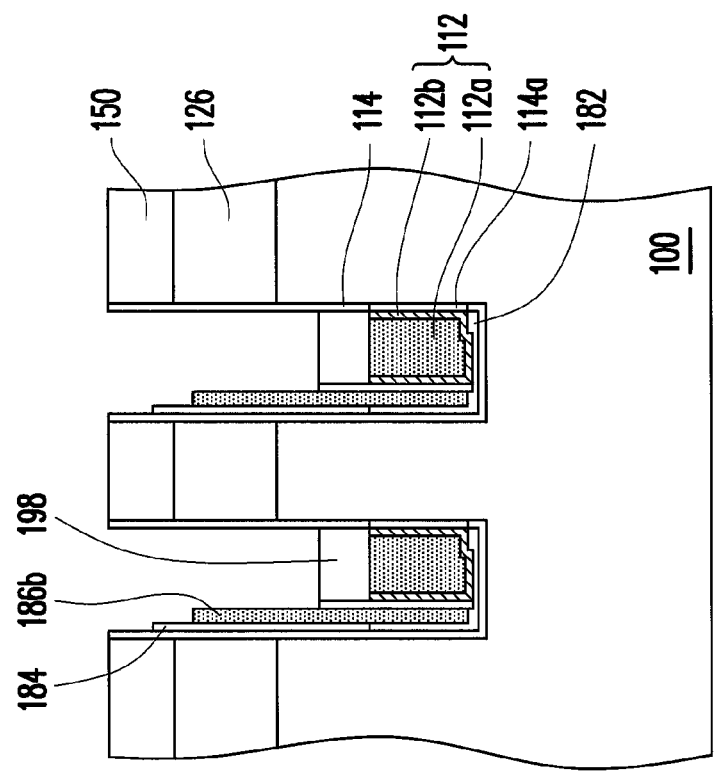
FIG. 5G(1)
FIG. 5G(2)

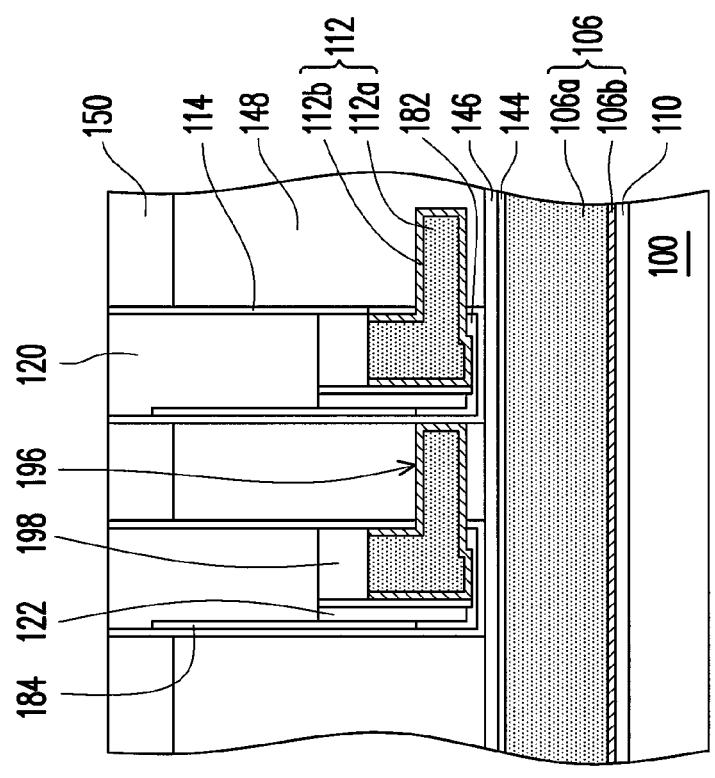
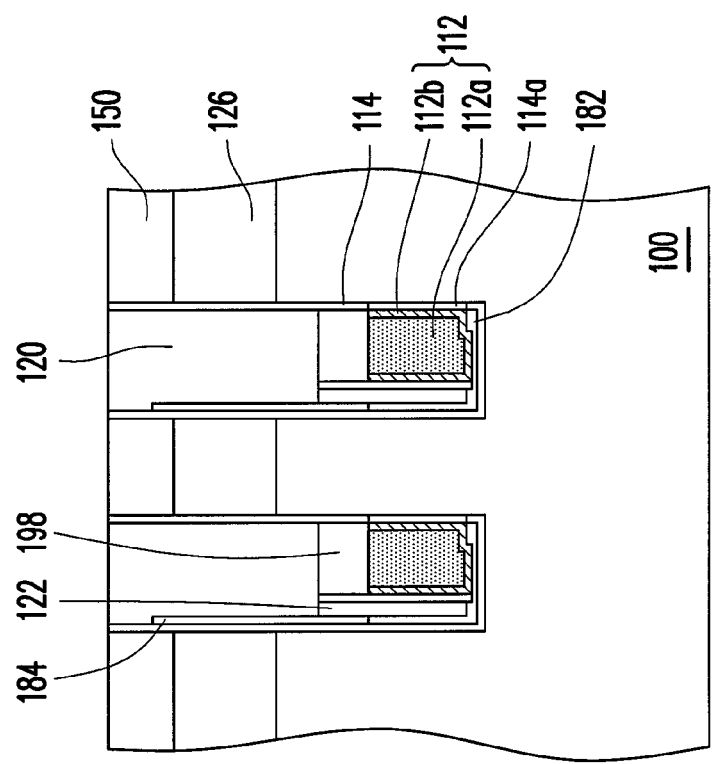
FIG. 5H(1)
FIG. 5H(2)

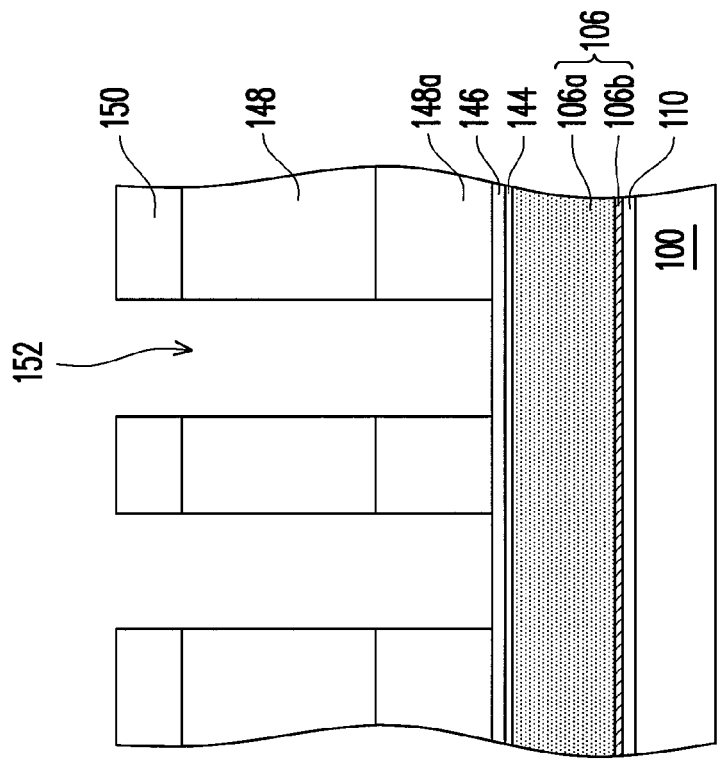
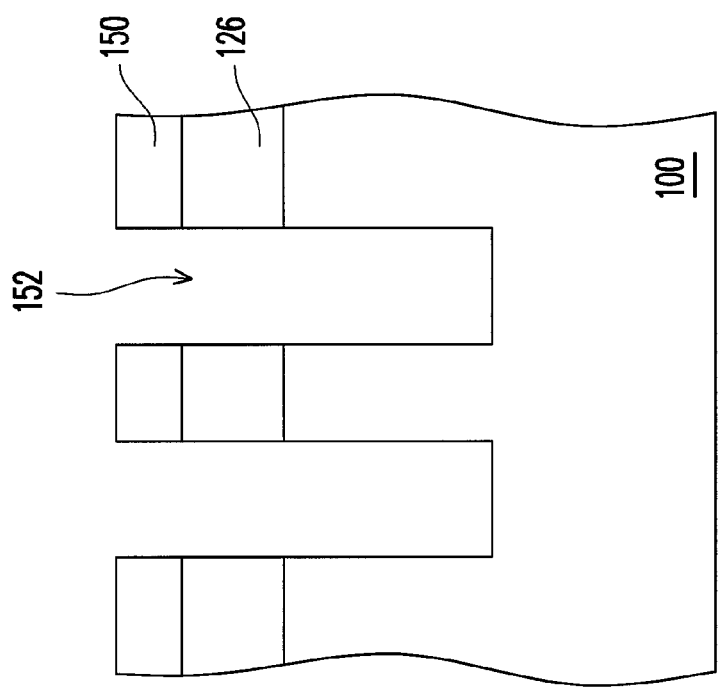
FIG. 6A(2)
FIG. 6A(1)

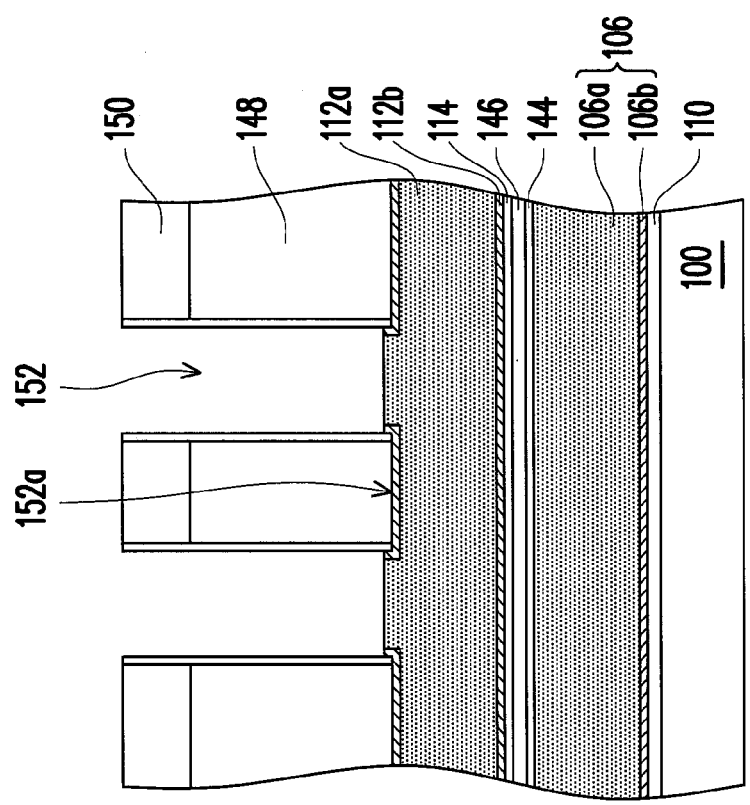
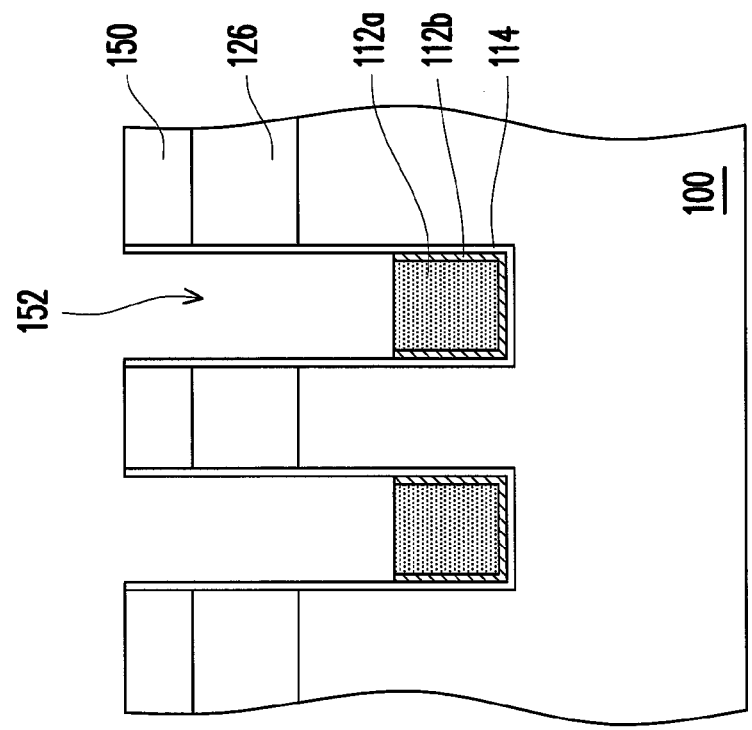
FIG. 6B(1)
FIG. 6B(2)

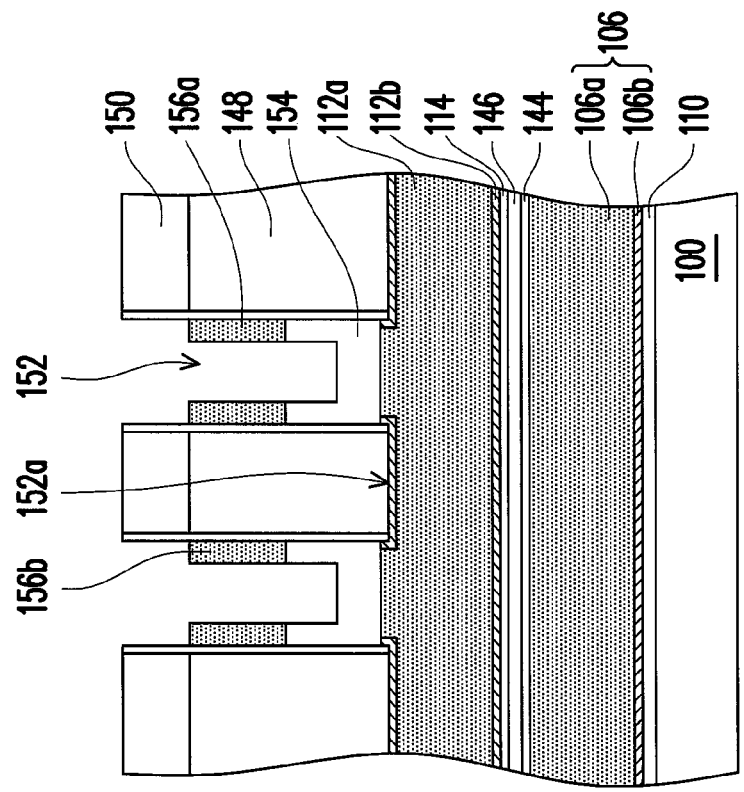
FIG. 6C(2)
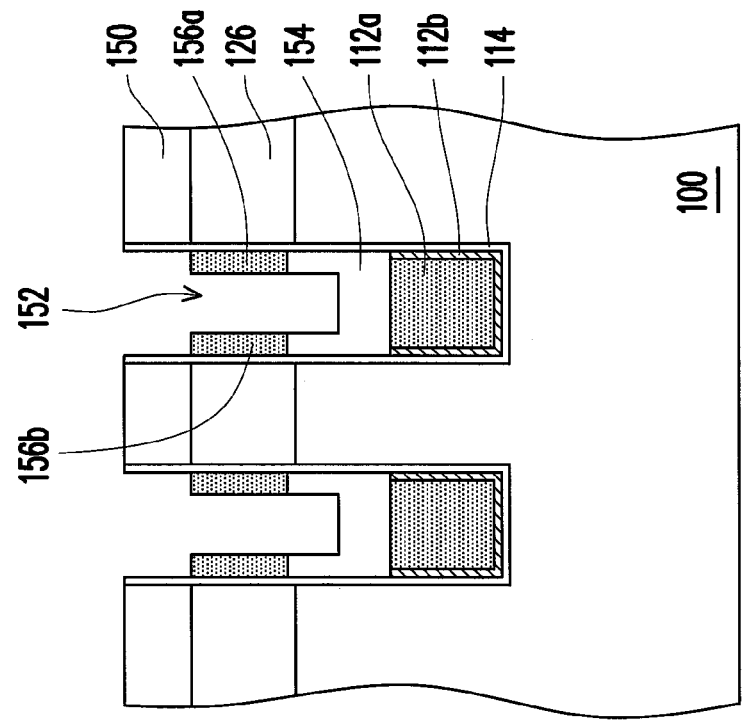
FIG. 6C(1)

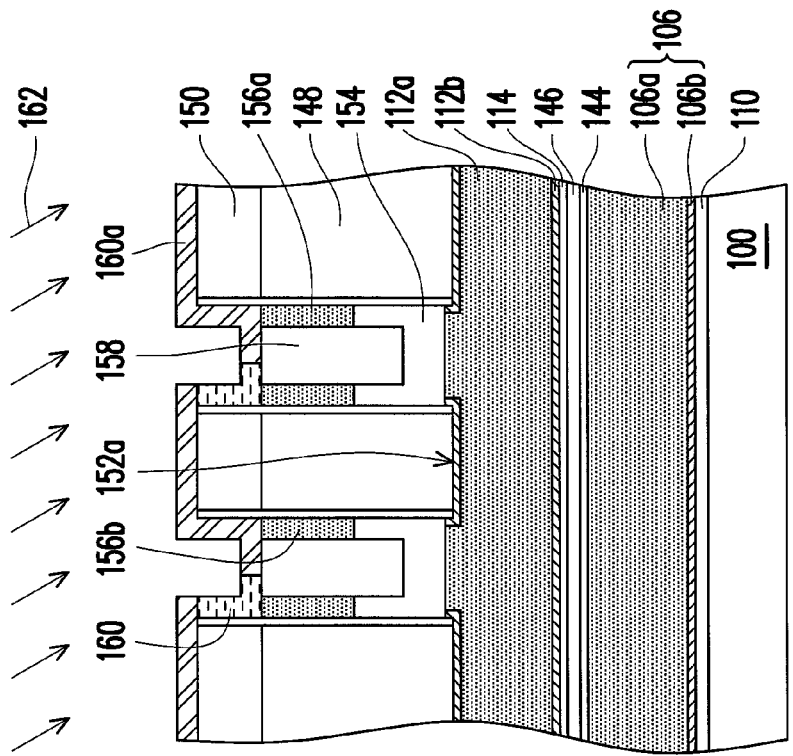
FIG. 6D(2)
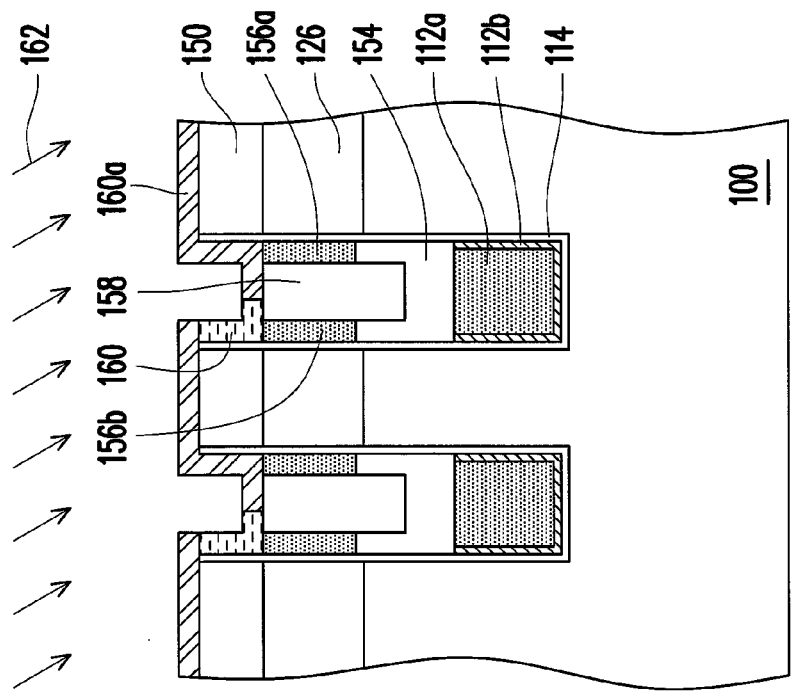
FIG. 6D(1)

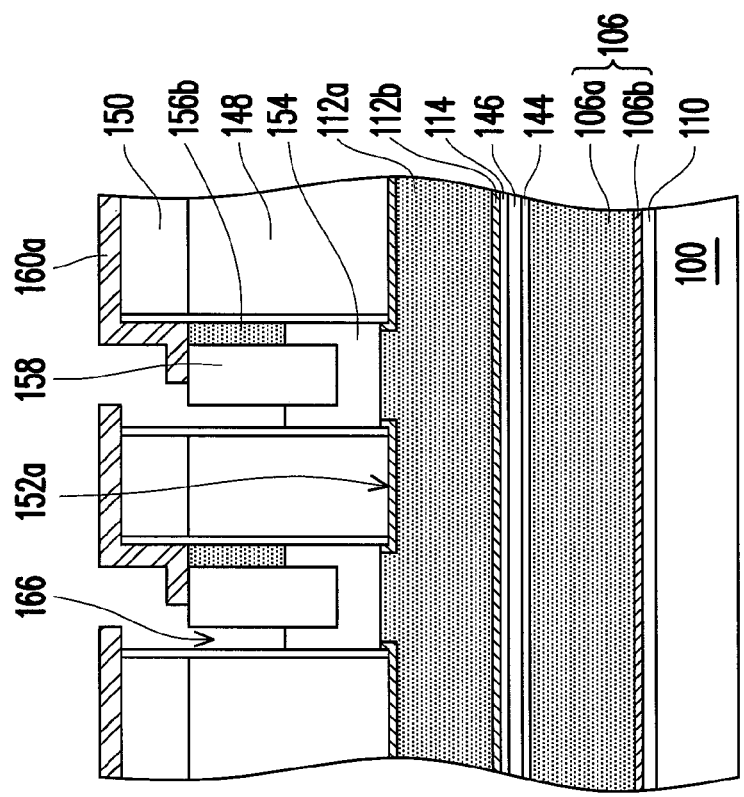
FIG. 6E(2)
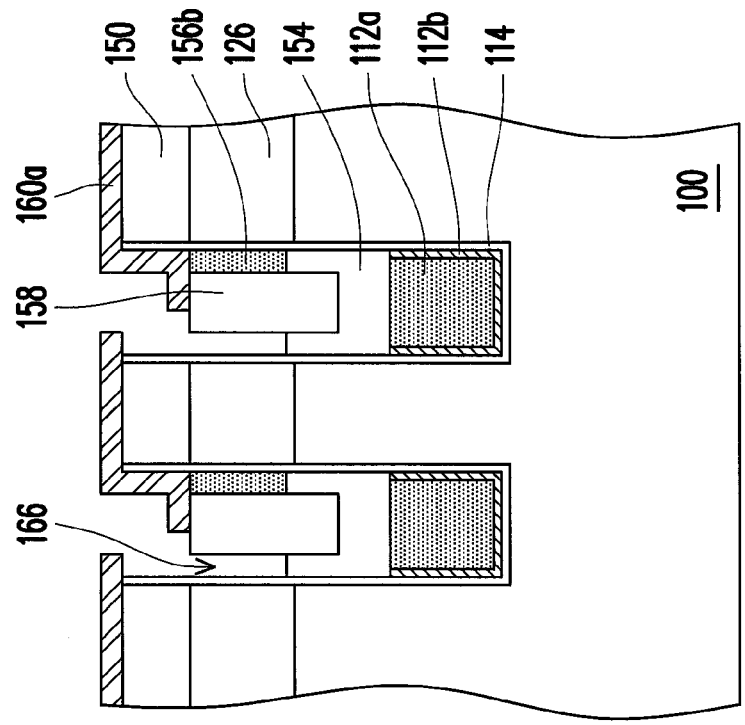
FIG. 6E(1)

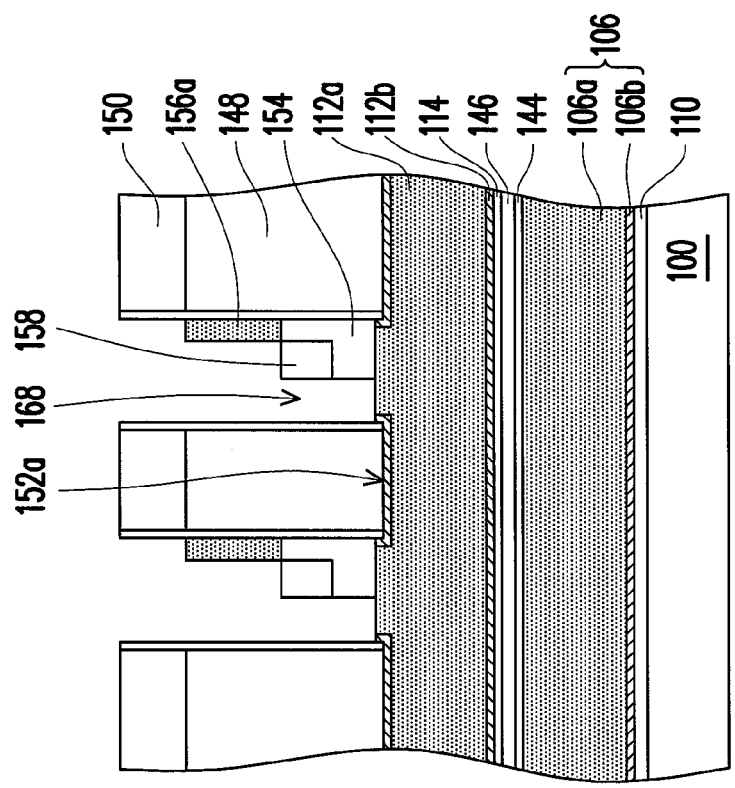
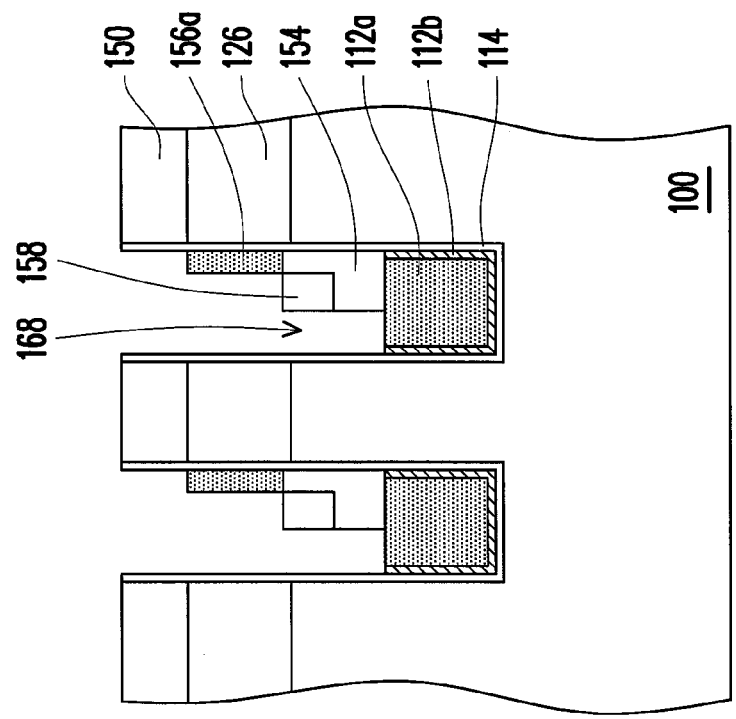
FIG. 6F(1)
FIG. 6F(2)

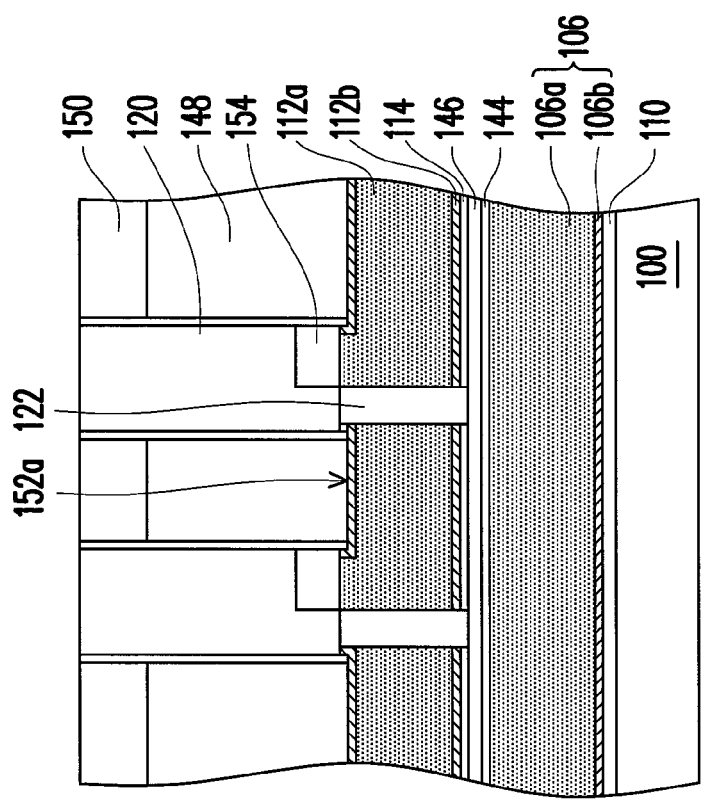
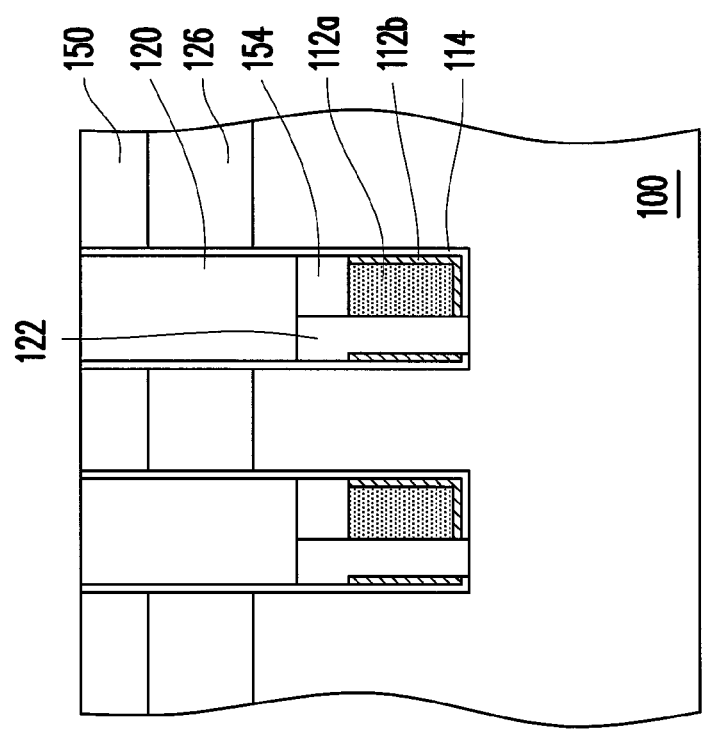
FIG. 6G(1)
FIG. 6G(2)

VERTICAL CHANNEL TRANSISTOR ARRAY AND MANUFACTURING METHOD THEREOF

BACKGROUND OF THE INVENTION

1. Field of the Invention

The invention relates to a semiconductor device and a manufacturing method thereof. More particularly, the invention relates to a vertical channel transistor array and a manufacturing method thereof.

2. Description of Related Art

With the development of powerful microprocessors, software is more capable of programming and calculating an increasing amount of data. Therefore, the fabrication of memories has become essential in the semiconductor industry. A dynamic random access memory (DRAM) is a volatile memory (VM) and is constituted by a plurality of memory cells. Each of the memory cells in the VM is mainly composed of a transistor and a capacitor, and all memory cells are electrically connected to one another through word lines (WL) and bit lines (BL).

As science advances day by day, the length of the channel region of each transistor in the DRAM is gradually decreased together with the reduction of the device dimension, so as to accelerate the operation of the device. Thereby, however, a significant short channel effect occurs in the transistors, and an On current is likely to decrease.

Accordingly, a conventional solution aims to change the horizontal transistor into the vertical transistor. In such a DRAM structure, the vertical transistors are formed in trenches, and embedded bit lines and embedded word lines are formed, as disclosed in U.S. Pat. No. 7,355,230.

Owing to increasing integrity of semiconductor devices, the dimension of the semiconductor devices needs to be decreased. As such, complexity of the semiconductor manufacturing process is raised, and electrical performance of the semiconductor is likely to be affected. Currently, researches are directed to formation of semiconductor devices with the reduced size and favorable performance.

SUMMARY OF THE INVENTION

In view of the above, the invention is directed to a vertical channel transistor array and a manufacturing method thereof for reducing size and improving performance of devices.

The invention provides a vertical channel transistor array including a plurality of semiconductor pillars, a plurality of embedded bit lines, and a plurality of embedded word lines. The semiconductor pillars are disposed in a semiconductor substrate and arranged in a column and row array. An active area of a vertical channel transistor is defined by the semiconductor pillars. The embedded bit lines are disposed in parallel in the semiconductor substrate and extended in a column direction. The embedded bit lines are electrically connected to the semiconductor pillars in the same column. The embedded word lines are disposed in parallel above the embedded bit lines and extended in a row direction. Besides, the embedded word lines and the semiconductor pillars in the same row are connected but spaced by a gate dielectric layer. Each of the embedded word lines is connected to first sides of the semiconductor pillars in the same row, and one of the embedded word lines is correspondingly connected to the semiconductor pillars arranged in one row.

According to an embodiment of the invention, an isolation structure is disposed between two of the embedded word lines adjacent to each other.

According to an embodiment of the invention, a cap layer is disposed on the isolation structure and each of the embedded word lines.

According to an embodiment of the invention, the isolation structure is an air gap or an insulating layer.

According to an embodiment of the invention, the vertical channel transistor array further includes a back gate disposed at second sides of the semiconductor pillars in the same row, and the first sides are opposite to the second sides.

According to an embodiment of the invention, each of the embedded word lines includes a conductive layer and a barrier layer. The barrier layer is disposed between the conductive layer and the semiconductor pillars.

According to an embodiment of the invention, each of the embedded word lines includes a plurality of extending portions, and each of the extending portions is disposed between two of the semiconductor pillars adjacent to each other in the same row.

According to an embodiment of the invention, each of the embedded word lines includes a conductive layer and a barrier layer. The barrier layer is disposed between the conductive layer and the semiconductor pillars. Besides, the barrier layer covers the semiconductor pillars.

The invention further provides a manufacturing method of a vertical channel transistor array. The method includes following steps. A plurality of first trenches are formed in a semiconductor substrate. The first trenches are arranged in parallel and extended along a column direction. A plurality of embedded bit lines are formed at bottoms of the first trenches, and the embedded bit lines are electrically connected to the semiconductor substrate. A plurality of second trenches are formed in the semiconductor substrate. The second trenches are arranged in parallel and extended in a row direction. The semiconductor substrate is divided by the first trenches and the second trenches into a plurality of semiconductor pillars. A gate dielectric layer is formed on surfaces of the semiconductor pillars. A plurality of embedded word lines are formed at bottoms of the second trenches, and each of the embedded word lines is located at a first side wall of one of the second trenches and connected to first sides of the semiconductor pillars in the same row. One of the embedded word lines is correspondingly connected to the semiconductor pillars arranged in one row. An isolation structure is formed between a second side wall of each of the second trenches and each of the embedded word lines. The first side wall is opposite to the second side wall.

According to an embodiment of the invention, the isolation structure is an air gap or an insulating layer.

According to an embodiment of the invention, the manufacturing method further includes forming a cap layer on the isolation structure and each of the embedded word lines after forming the isolation structure.

According to an embodiment of the invention, steps of forming the embedded word lines include sequentially forming a first barrier layer and a first conductive layer in the second trenches; removing a portion of the first barrier layer and a portion of the first conductive layer, such that a surface of the first barrier layer and a surface of the first conductive layer are lower than a surface of the semiconductor substrate; patterning the first barrier layer and the first conductive layer, forming the embedded word lines on the first side walls of the second trenches, and forming an opening between the second side wall of each of the second trenches and each of the embedded word lines, respectively.

According to an embodiment of the invention, in the step of patterning the first barrier layer and the first conductive layer, the first barrier layer located on the second side wall of each of the second trenches is left.

According to an embodiment of the invention, steps of patterning the first barrier layer and the first conductive layer includes forming a first gap-filling material layer in the second trenches, wherein a surface of the first gap-filling material layer is lower than top surfaces of the second trenches; forming a first liner layer on the second side wall of each of the second trenches; forming a second gap-filling material layer in the second trenches, wherein a surface of the second gap-filling material layer is lower than the top surfaces of the second trenches and exposes the first liner layer; forming a patterned mask layer on the semiconductor substrate, wherein the patterned mask layer has a first opening exposing the first liner layer on the second side wall of each of the second trenches; removing the first liner layer on the second side wall of each of the second trenches to form a second opening; removing a portion of the first gap-filling material layer and a portion of the second gap-filling material layer exposed by the second opening; removing the patterned mask layer and the first liner layer on the first side wall of each of the second trenches, and removing a portion of the first barrier layer and a portion of the first conductive layer by using the remaining first gap-filling material layer and the remaining second gap-filling material layer as a mask, so as to form the embedded word lines.

According to an embodiment of the invention, the manufacturing method further includes forming a hard mask that covers ends of the embedded word lines before the first liner layer on the second side wall of each of the second trenches is removed to form the second opening.

According to an embodiment of the invention, steps of forming the patterned mask layer on the semiconductor substrate include forming a second liner layer on the semiconductor substrate, wherein the second trenches are not completely filled with the second liner layer; performing a tilted ion implantation process to modify the second liner layer on the top surfaces of the second trenches and on the first side wall of each of the second trenches, and removing the second liner layer on the second side wall of each of the second trenches to form the patterned mask layer.

According to an embodiment of the invention, a material of the second liner layer and a material of the first liner layer are the same, and the first liner layer on the second side wall of each of the second trenches is removed when the second liner layer on the second side wall of each of the second trenches is removed, so as to form the second opening.

According to an embodiment of the invention, steps of forming the embedded word lines include: filling the first trenches with a sacrificial layer and then forming the second trenches; forming a first liner layer on the second side wall of each of the second trenches; forming a gap-filling material layer in the second trenches, wherein a surface of the gap-filling material layer is lower than top surfaces of the second trenches and exposes the first liner layer; forming a patterned mask layer on the semiconductor substrate, wherein the patterned mask layer has a first opening that exposes the first liner layer on the second side wall of each of the second trenches; removing the first liner layer on the second side wall of each of the second trenches to form a second opening; removing the patterned mask layer, the gap-filling material layer, and the sacrificial layer; sequentially forming a first barrier layer and a first conductive layer on the semiconductor substrate; removing a portion of the first barrier layer and a portion of the first conductive layer, such that a surface of the first barrier layer and a surface of the first conductive layer are lower than the first liner layer, and that the embedded word lines are formed on the first side walls of the second trenches, wherein the embedded word lines include a plurality of extending portions, and each of the extending portions is disposed between two of the semiconductor pillars adjacent to each other in the same row; removing the first liner layer and respectively forming an opening between the second side wall of each of the second trenches and each of the embedded word lines.

According to an embodiment of the invention, the manufacturing method further includes forming a hard mask that covers ends of the embedded word lines before the first liner layer on the second side wall of each of the second trenches is removed to form the second opening.

According to an embodiment of the invention, steps of forming the patterned mask layer on the semiconductor substrate include forming a second liner layer on the semiconductor substrate, wherein the second trenches are not completely filled with the second liner layer; performing a tilted ion implantation process to modify the second liner layer on the top surfaces of the second trenches and on the first side wall of each of the second trenches, and removing the second liner layer on the second side wall of each of the second trenches to form the patterned mask layer.

According to an embodiment of the invention, a material of the second liner layer and a material of the first liner layer are the same, and the first liner layer on the second side wall of each of the second trenches is removed when the second liner layer on the second side wall of each of the second trenches is removed, so as to form the second opening.

According to an embodiment of the invention, steps of forming the embedded word lines include: forming an insulating layer on the semiconductor substrate and then forming the second trenches; forming a first gap-filling material layer in the second trenches, wherein a first distance exists between a surface of the first gap-filling material layer and top surfaces of the second trenches; forming a pad layer on a surface of the insulating layer exposed by the first gap-filling material layer; removing a portion of the first gap-filling material layer, such that a second distance exists between the surface of the first gap-filling material layer and the top surfaces of the second trenches, wherein the second distance is greater than the first distance; forming a first liner layer on the surface of the insulating layer and a surface of the pad layer, wherein the surface of the insulating layer and the surface of the pad layer are exposed by the first gap-filling material layer; forming a second gap-filling material layer in the second trenches, wherein a surface of the second gap-filling material layer is lower than the top surfaces of the second trenches and exposes the first liner layer; forming a patterned mask layer on the semiconductor substrate, wherein the patterned mask layer has a first opening that exposes the first liner layer on the second side wall of each of the second trenches; removing the first liner layer on the second side wall of each of the second trenches to form a second opening; removing the patterned mask layer and the second gap-filling material layer; removing a portion of the first gap-filling material layer and a portion of the insulating layer that are exposed by the pad layer; sequentially forming a first barrier layer and a first conductive layer on the semiconductor substrate; removing a portion of the first barrier layer and a portion of the first conductive layer, such that a surface of the first barrier layer and a surface of the first conductive layer are lower than a surface of the first liner layer, and that the embedded word lines are formed on the first side walls of the second trenches, wherein the embedded word lines include a plurality of extending portions, and each of the extending portions is disposed between two of the semiconductor pillars adjacent to each other in the same row; removing the first liner layer and respectively forming an opening between the second side wall of each of the second trenches and each of the embedded word lines.

According to an embodiment of the invention, the manufacturing method further includes forming a hard mask that covers ends of the embedded word lines before the first liner layer on the second side wall of each of the second trenches is removed to form the second opening.

According to an embodiment of the invention, steps of forming the patterned mask layer on the semiconductor substrate include forming a second liner layer on the semiconductor substrate, wherein the second trenches are not completely filled with the second liner layer; performing a tilted ion implantation process to modify the second liner layer on the top surfaces of the second trenches and on the first side wall of each of the second trenches, and removing the second liner layer on the second side wall of each of the second trenches to form the patterned mask layer.

According to an embodiment of the invention, a material of the second liner layer and a material of the first liner layer are the same, and the first liner layer on the second side wall of each of the second trenches is removed when the second liner layer on the second side wall of each of the second trenches is removed, so as to form the second opening.

According to an embodiment of the invention, steps of forming the embedded word lines include: sequentially forming a sacrificial layer and an insulating layer on the semiconductor substrate and then forming the second trenches; removing the sacrificial layer and forming a plurality of third trenches above the embedded bit lines; sequentially forming a first barrier layer and a first conductive layer in the second trenches and the third trenches; removing a portion of the first barrier layer and a portion of the first conductive layer, such that a surface of the first barrier layer and a surface of the first conductive layer are lower than a surface of the semiconductor substrate; patterning the first barrier layer and the first conducive layer, forming the embedded word lines on the first side walls of the second trenches, and respectively forming an opening between the second side wall of each of the second trenches and each of the embedded word lines, wherein the embedded word lines include a plurality of extending portions, and each of the extending portions is disposed between two of the semiconductor pillars adjacent to each other in the same row.

According to an embodiment of the invention, in the step of patterning the first barrier layer and the first conductive layer, the first barrier layer located on the second side wall of each of the second trenches is left.

According to an embodiment of the invention, steps of patterning the first barrier layer and the first conductive layer includes forming a first gap-filling material layer in the second trenches, wherein a surface of the first gap-filling material layer is lower than top surfaces of the second trenches; forming a first liner layer on the second side wall of each of the second trenches; forming a second gap-filling material layer in the second trenches, wherein a surface of the second gap-filling material layer is lower than the top surfaces of the second trenches and exposes the first liner layer; forming a patterned mask layer on the semiconductor substrate, wherein the patterned mask layer has a first opening exposing the first liner layer on the second side wall of each of the second trenches; removing the first liner layer on the second side wall of each of the second trenches to form a second opening; removing a portion of the first gap-filling material layer and a portion of the second gap-filling material layer that are exposed by the second opening; removing the patterned mask layer and the first liner layer on the first side wall of each of the second trenches, and removing a portion of the first barrier layer and a portion of the first conductive layer by using the remaining first gap-filling material layer and the remaining second gap-filling material layer as a mask, so as to form the embedded word lines.

According to an embodiment of the invention, the manufacturing method further includes forming a hard mask that covers ends of the embedded word lines before the first liner layer on the second side wall of each of the second trenches is removed to form the second opening.

According to an embodiment of the invention, steps of forming the patterned mask layer on the semiconductor substrate include forming a second liner layer on the semiconductor substrate, wherein the second trenches are not completely filled with the second liner layer; performing a tilted ion implantation process to modify the second liner layer on the top surfaces of the second trenches and on the first side wall of each of the second trenches, and removing the second liner layer on the second side wall of each of the second trenches to form the patterned mask layer.

According to an embodiment of the invention, a material of the second liner layer and a material of the first liner layer are the same, and the first liner layer on the second side wall of each of the second trenches is removed when the second liner layer on the second side wall of each of the second trenches is removed, so as to form the second opening.

In the vertical channel transistor array of the invention, only one of the embedded word lines is disposed on the semiconductor pillars in one row, and therefore device dimension can be reduced. Besides, each of the embedded word lines selectively has a plurality of extending portions. Each of the extending portions is disposed between two adjacent semiconductor pillars in the same row, so as to increase the channel area of the device and effectively prevent short channel effects. Thereby, device performance is improved.

On the other hand, in the vertical channel transistor array of the invention, the embedded word lines and the back gate are respectively disposed at two opposite sides of the semiconductor pillars. The back gate can protect the semiconductor pillars from being etched during the etching process. Meanwhile, during operation of the semiconductor device of the invention, the adjacent embedded word lines are not interfered with each other, so as to improve device performance.

In the vertical channel transistor array of the invention, the isolation structure is formed between two adjacent embedded word lines to isolate the adjacent embedded word lines.

According to the manufacturing method of the vertical channel transistor array of the invention, in steps of forming the embedded word lines, the liner layer is formed, a tilted ion implantation process is performed to modify the liner layer, and the unmodified liner layer is removed to form the patterned mask layer. Since no photolithography process is performed, openings with reduced size can be formed.

Additionally, in the manufacturing method of the vertical channel transistor array of the invention, the peripheral regions of the semiconductor device array are not immersed in the etchant because the hard mask covers the ends of the embedded word lines. As such, short circuit phenomenon or abnormal connection can be precluded.

To make the above and other features and advantages of the invention more comprehensible, several embodiments accompanied with figures are detailed as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A(1)~FIG. 2M(1) are cross-sectional views illustrating a manufacturing process depicted in FIG. 1C taken along the line A-A'.

FIG. 2A(2)~FIG. 2M(2) are cross-sectional views illustrating a manufacturing process depicted in FIG. 1C taken along the line B-B'.

FIG. 2A(3)~FIG. 2F(3) are cross-sectional views illustrating a manufacturing process depicted in FIG. 1C taken along the line C-C'.

FIG. 4A(1)~FIG. 4G(1) are cross-sectional views illustrating a manufacturing process depicted in FIG. 1G taken along a line A-A'.

FIG. 4A(2)~FIG. 4G(2) are cross-sectional views illustrating a manufacturing process depicted in FIG. 1G taken along a line B-B'.

FIG. 5A(1)~FIG. 5H(1) are cross-sectional views illustrating a manufacturing process depicted in FIG. 1G taken along the line A-A'.

FIG. 5A(2)~FIG. 5H(2) are cross-sectional views illustrating a manufacturing process depicted in FIG. 1G taken along the line B-B'.

FIG. 6A(1)~FIG. 6G(1) are cross-sectional views illustrating a manufacturing process depicted in FIG. 1H taken along a line A-A'.

FIG. 6A(2)~FIG. 6G(2) are cross-sectional views illustrating a manufacturing process depicted in FIG. 1H taken along a line B-B'.

DESCRIPTION OF EMBODIMENTS

The invention provides a vertical channel transistor array exemplarily applied to a DRAM in the following descriptions.

Figure 1A:
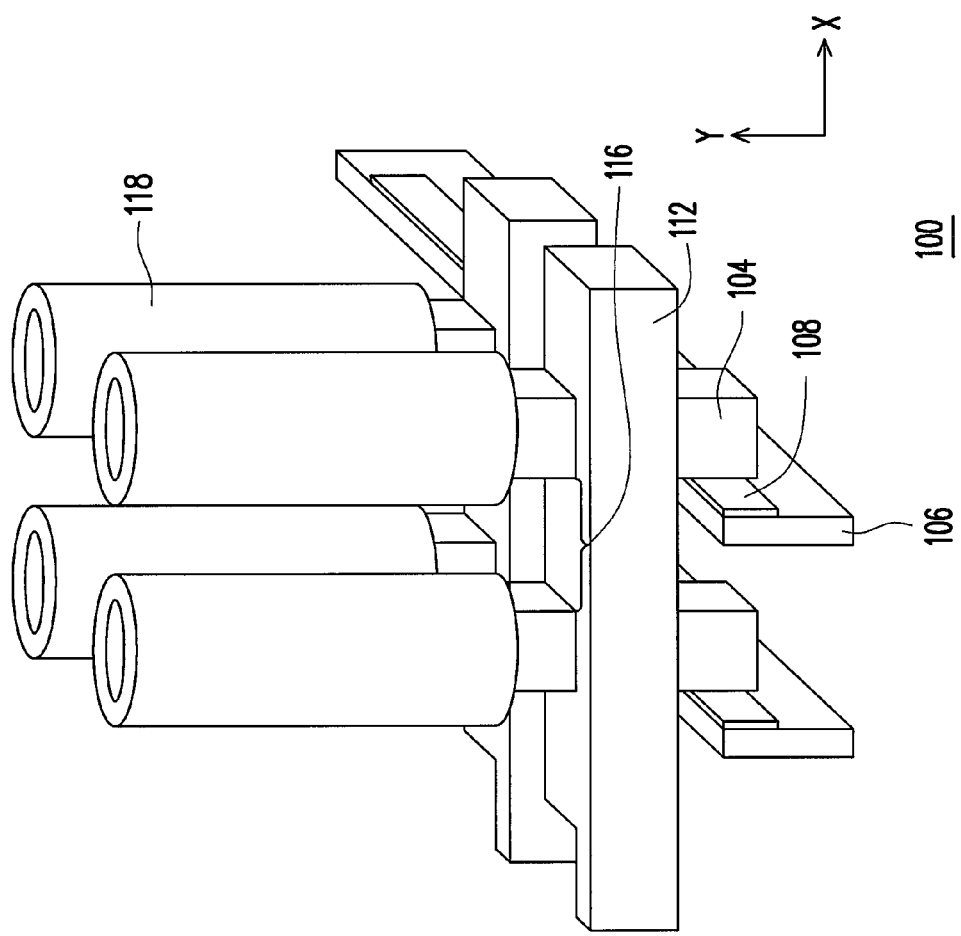
FIG. 1A is a partial perspective view illustrating a DRAM having a vertical channel transistor array according to an embodiment of the invention.

FIG. 1A is a partial perspective view illustrating a DRAM having a vertical channel transistor array according to an embodiment of the invention. To simplify the drawings, only the main components including semiconductor pillars, embedded bit lines, bit line contacts, embedded word lines, and capacitor nodes are depicted.

Figure 1B:
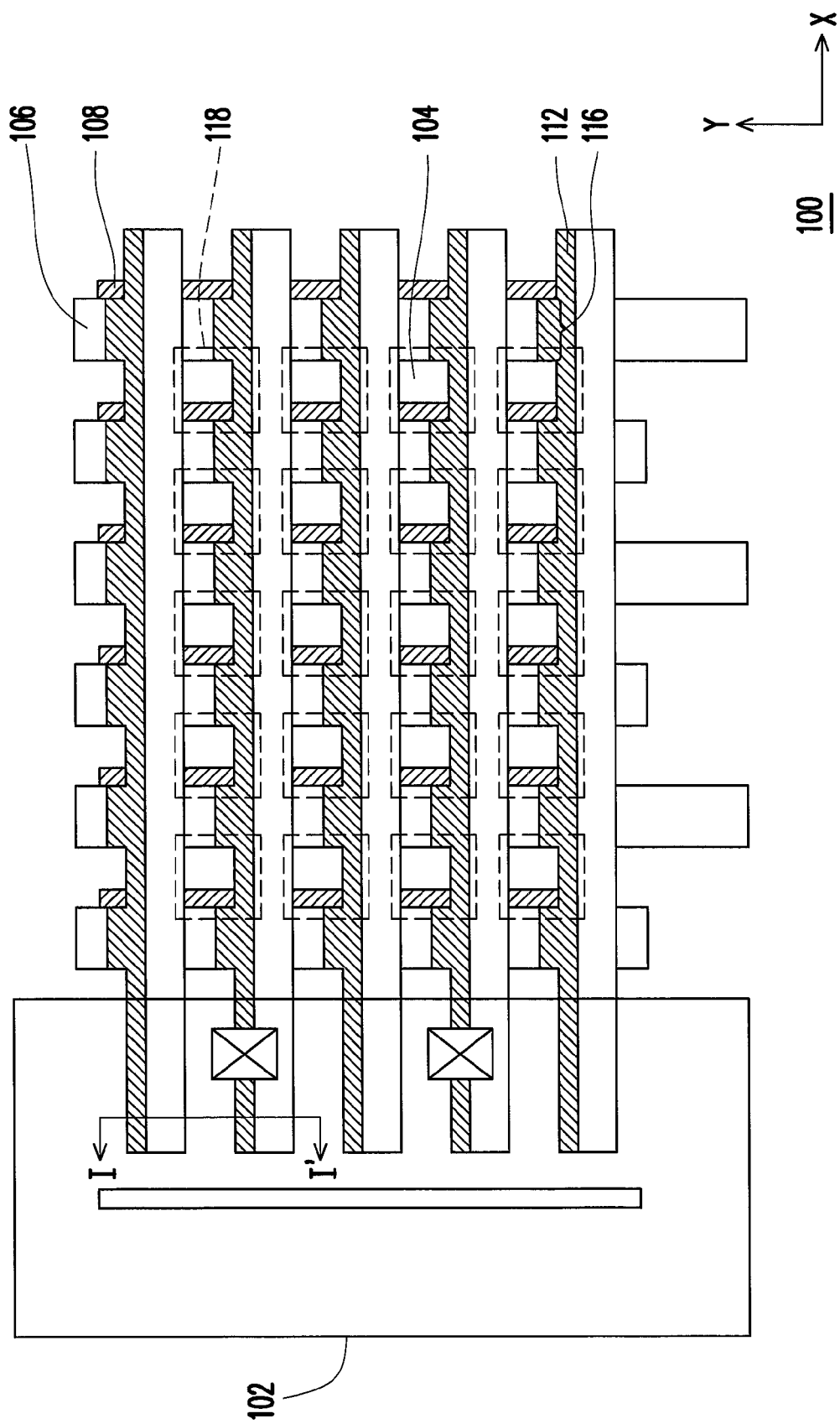
FIG. 1B is a top view illustrating a DRAM having a vertical channel transistor array according to an embodiment of the invention.
Figure 1D:
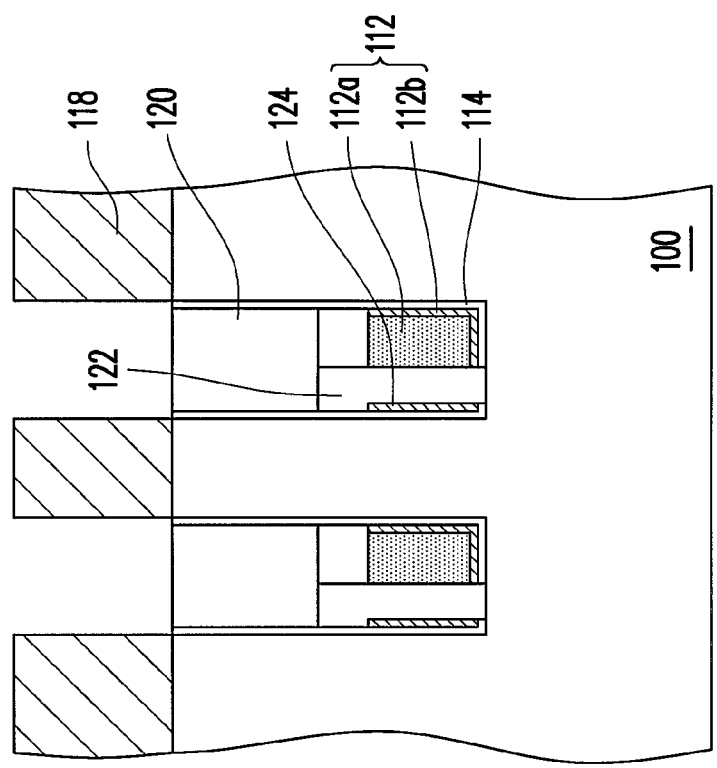
FIG. 1D is a cross-sectional view taken along a line A-A' depicted in FIG. 1C.
Figure 1C:
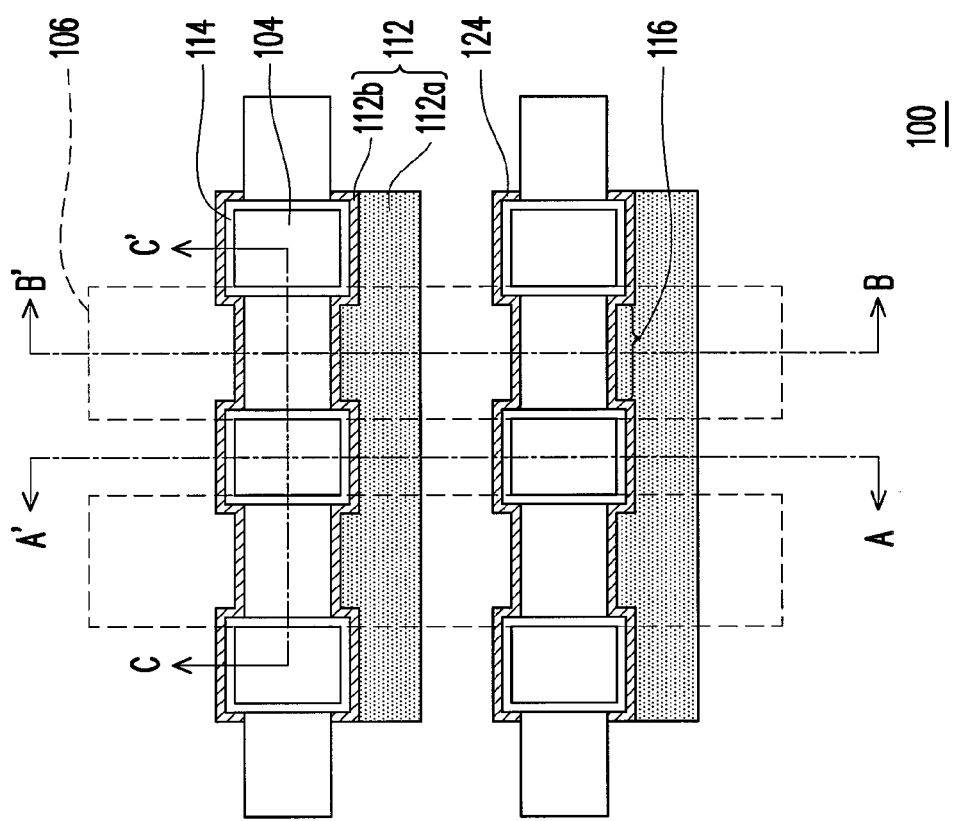
FIG. 1C is a partially enlarged view of FIG. 1B.
Figure 1F:
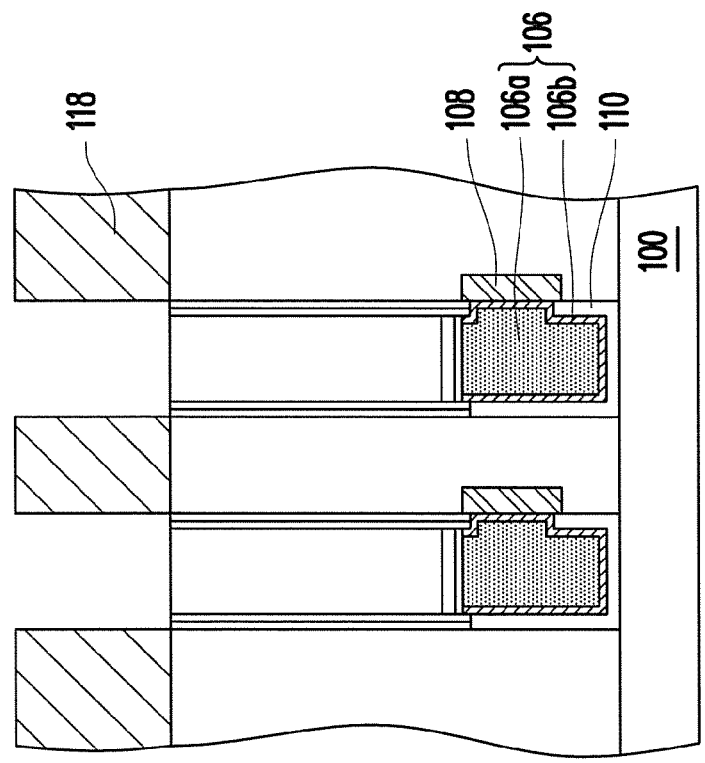
FIG. 1F is a cross-sectional view taken along a line C-C' depicted in FIG. 1C.
Figure 1E:
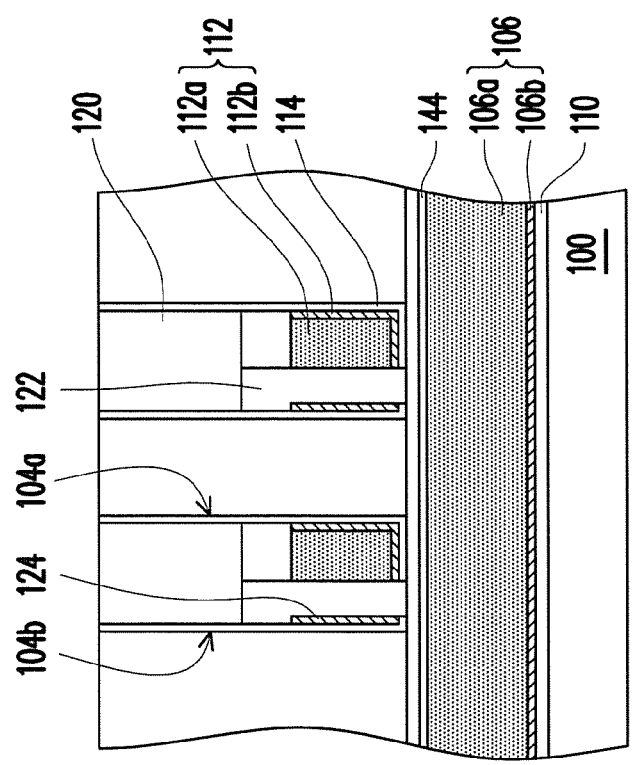
FIG. 1E is a cross-sectional view taken along a line B-B' depicted in FIG. 1C.

FIG. 1B is a top view illustrating a DRAM having a vertical channel transistor array according to an embodiment of the invention. FIG. 1C is a partially enlarged view of FIG. 1B. FIG. 1D is a cross-sectional view taken along a line A-A' depicted in FIG. 1C. FIG. 1E is a cross-sectional view taken along a line B-B' depicted in FIG. 1C. FIG. 1F is a cross-sectional view taken along a line C-C' depicted in FIG. 1C.

Figure 1H:
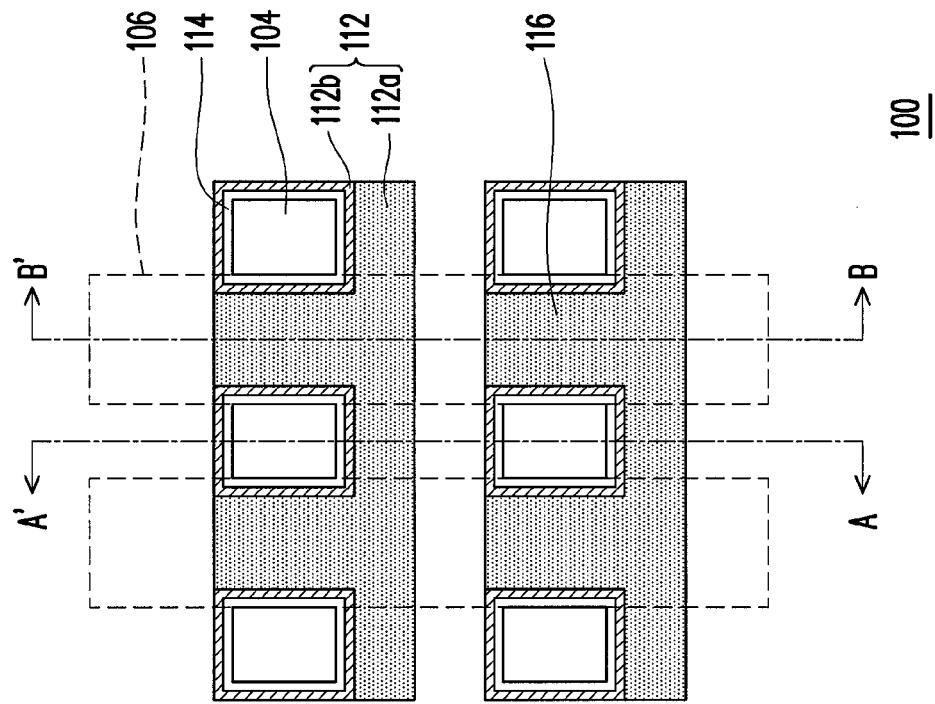
FIG. 1G and FIG. 1H are top views illustrating a DRAM having a vertical channel transistor array according to other embodiments of the invention.
Figure 1G:
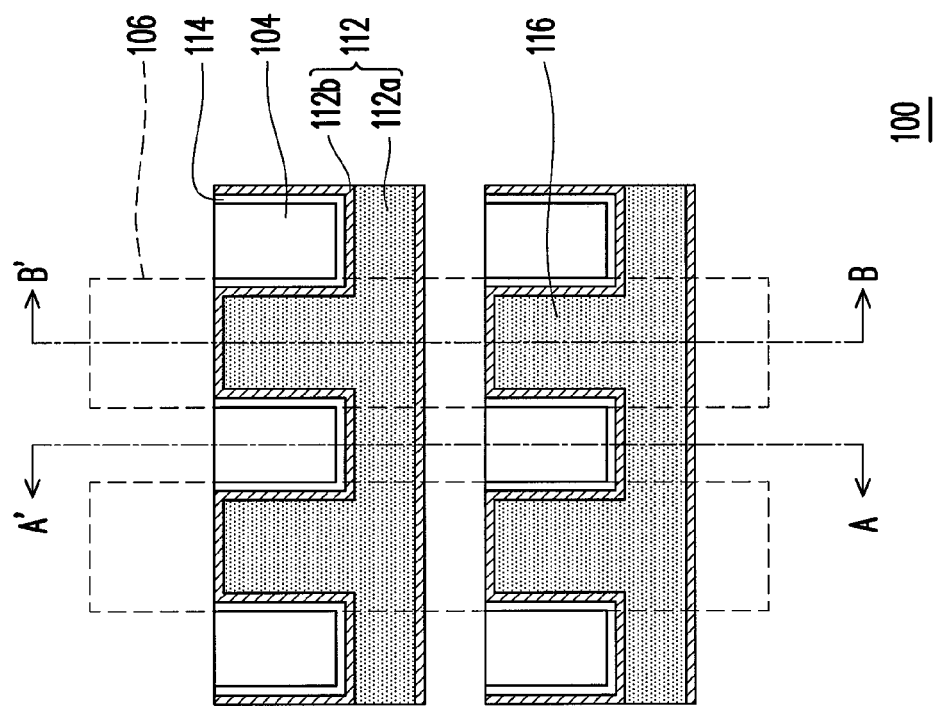

FIG. 1G and FIG. 1H are top views illustrating a DRAM having a vertical channel transistor array according to other embodiments of the invention.

With reference to FIG. 1A to FIG. 1F, the DRAM having the vertical channel transistor array is disposed in a semiconductor substrate 100 according to this invention. The semiconductor substrate 100, for example, is a silicon substrate.

The vertical channel transistor array includes a plurality of semiconductor pillars 104, a plurality of embedded bit lines 106, a plurality of bit line contacts 108, an insulating layer 110, a plurality of embedded word lines 112, a gate dielectric layer 114, an isolation structure 122, and a back gate 124.

The semiconductor pillars 104 are disposed in the semiconductor substrate 100 and arranged in a column and row array. An active area of the vertical channel transistor is defined by the semiconductor pillars 104.

The embedded bit lines 106 are disposed in parallel in the semiconductor substrate 100 and extended in a column direction (Y direction). The embedded bit lines 106 are formed by a conductive layer 106a and a barrier layer 106b, for instance. A material of the conductive layer 106a includes a metallic material, such as tungsten, copper, aluminum, a copper-aluminum alloy, a silicon-copper-aluminum alloy, and so on. The barrier layer 106, for instance, is titanium (Ti)/titanium nitride (TiN) and cobalt (Co)/TiN.

Each of the bit line contacts 108 is respectively disposed at a side of one of the embedded bit lines 106, and one of the embedded bit lines 106 is electrically connected to the semiconductor pillars 104 in the same column through the bit line contacts 108. A material of the bit line contacts 108 includes silicide, such as titanium silicide, cobalt silicide, and so on.

The insulating layer 110 is disposed between the embedded bit lines 106 and the semiconductor substrate 100.

The embedded word lines 112 are disposed in parallel above the embedded bit lines 106 and extended in a row direction (X direction). Besides, the embedded word lines 112 and the semiconductor pillars 104 in the same row are connected but spaced by the gate dielectric layer 114. Each of the embedded word lines 112 is connected to first sides of the semiconductor pillars 104 in the same row, and one of the embedded word lines 112 is correspondingly connected to the semiconductor pillars 104 arranged in one row. Each of the embedded word lines 112 selectively has a plurality of extending portions 116. Each of the extending portions 116 is disposed between two of the semiconductor pillars 104 adjacent to each other in the same row. In an embodiment of the invention, as shown in FIG. 1G or FIG. 1H, space between two adjacent semiconductor pillars 104 in the same row is filled with each of the extending portions 116.

The embedded word lines 112 are formed by a conductive layer 112a and a barrier layer 112b, for instance. A material of the conductive layer 112a includes a metallic material, such as tungsten, copper, aluminum, a copper-aluminum alloy, a silicon-copper-aluminum alloy, and so on. A material of the barrier layer 112b, for instance, is TiN, Ti/TiN, Co/TiN, and so forth. According to an embodiment of the invention, as shown in FIG. 1H, the barrier layer 112a covers the semiconductor pillars 104.

The isolation structure 122 is disposed between two adjacent embedded word lines 112, and the isolation structure 122, for example, is an air gap or an insulating layer. When the isolation structure 122 is an insulating layer, the isolation structure 122 is, for example, made of silicon oxide, silicon nitride, and so forth.

The cap layer 120 is disposed on the isolation structure 122 and each of the embedded word lines 112. A material of the cap layer 120 is, for example, silicon oxide, silicon nitride, etc.

The back gate 124 is disposed at second sides of the semiconductor pillars 104 in the same row, and the first sides 104a are opposite to the second sides 104b. A material of the back gate 124, for instance, is TiN, Ti/TiN, Co/TiN, and so forth. The back gate 124 can protect the semiconductor pillars 104 from being etched during the etching process. Meanwhile, during operation of the semiconductor device of the invention, the adjacent embedded word lines are not interfered with each other, so as to improve device performance.

As indicated in FIG. 1A, ends of the semiconductor pillars 104 are connected to the embedded bit lines 106 through the bit line contacts 108, while the other ends of the semiconductor pillars 104 are connected to the capacitor nodes 118.

In the vertical channel transistor array of the invention, only one of the embedded word lines 112 is disposed on the semiconductor pillars 104 in one row, and therefore device dimension can be reduced. Besides, each of the embedded word lines 112 selectively has a plurality of extending portions 116. Each of the extending portions 116 is disposed between two adjacent semiconductor pillars 104 in the same row, so as to increase the channel area of the device and effectively prevent short channel effects. Thereby, device performance is improved.

The embedded word lines 112 and the back gate 124 are respectively disposed on the two opposite sides of the semiconductor pillars 104. The back gate 124 can protect the semiconductor pillars 104 from being etched during the etching process. Meanwhile, during operation of the semiconductor device of the invention, the adjacent embedded word lines 112 are not interfered with each other, thus improving device performance.

In addition, the isolation structure 122 is disposed between two adjacent embedded word lines 112, so as to isolate the adjacent embedded word lines 112.

The manufacturing method of the DRAM having the vertical channel transistor array is described hereinafter.

First Embodiment

FIG. 2A(1)~FIG. 2M(1) are cross-sectional views illustrating a manufacturing process depicted in FIG. 1C taken along the line A-A'. FIG. 2A(2)~FIG. 2M(2) are cross-sectional views illustrating a manufacturing process depicted in FIG. 1C taken along the line B-B'. FIG. 2A(3)~FIG. 2F(3) are cross-sectional views illustrating a manufacturing process depicted in FIG. 1C taken along the line C-C'.

With reference to FIG. 2A(1) to FIG. 2A(3), a semiconductor substrate 100 is provided. The semiconductor substrate 100, for example, is a silicon substrate.

A mask layer 126 is formed on the substrate 100. A material of the mask layer 126 is, for example, silicon nitride. A method of forming the mask layer 126 is, for example, chemical vapor deposition. The mask layer 126 and the semiconductor substrate 100 are patterned to form a plurality of trenches 128. The trenches 128 are disposed in parallel in the semiconductor substrate 100 and extended in a column direction (Y direction). Thereafter, an insulating layer 110 is formed on the semiconductor substrate 100. A material of the insulating layer 110 is, for example, silicon oxide, and a method of forming the insulating layer 110 is, for example, thermal oxidation or chemical vapor deposition.

With reference to FIG. 2B(1) to FIG. 2B(3), a gap-filling material layer 132 is formed in the trenches 128. A distance W1 exists between a surface of the gap-filling material layer 132 and top surfaces of the trenches 128. A material of the gap-filling material layer 132 is, for example, polysilicon. The gap-filling material layer 132 is formed by forming a material layer completely filling the trenches 128 and performing an etch-back process to remove a portion of the material layer, for instance.

A liner layer 134 is then formed on a surface of the insulating layer 110 exposed by the gap-filling material layer 132. A material of the liner layer 134 and a material of the insulating layer 110 have different etching selectivity. Here, the material of the line layer 134 is, for example, silicon nitride, and a method of forming the liner layer 134 is, for example, nitridation or chemical vapor deposition.

An anisotropic etching process is then carried out, and the liner layer 134 on the side wall of each of the trenches 128 is left.

With reference to FIG. 2C(1) to FIG. 2C(3), a portion of the gap-filling material layer 132 is removed, such that a distance W2 exists between the surface of the gap-filling material layer 132 and the top surfaces of the trenches 128, and the distance W2 is greater than the distance W1. The portion of the gap-filling material layer 132 is removed by dry etching or wet etching, for instance.

Another liner layer 136 is formed on the semiconductor substrate 100. A material of the liner layer 136, the material of the liner layer 134, and the material of the insulating layer 110 have different etching selectivity. A material of the liner layer 136 is, for example, Ti, TiN, tantalum (Ta), tantalum nitride (TaN), and tungsten nitride. A method of forming the liner layer 136 includes, for example, chemical vapor deposition or physical vapor deposition. An anisotropic etching process is then carried out, and the liner layer 136 on the surface of the insulating layer 110 exposed by the gap-filling material layer 132 and on the surface of the liner layer 134 exposed by the gap-filling material layer 132 is left.

A mask layer 138 is then formed on the semiconductor substrate 100 to completely fill the trenches 128. A material of the mask layer 138 is, for instance, tetra-ethyl-ortho-silicate (TEOS) silicon oxide, boron-phosphorous doped TEOS (BP-TEOS) silicon oxide, and boron phosphorous silicon glass (BPSG) formed by performing an atmospheric pressure chemical vapor deposition (APCVD) process with use of TEOS as a reactive gas. The mask layer 138 is patterned to form an opening 140. The opening 140 exposes the liner layer 136 located on one side wall of each of the trenches 128. The mask layer 138 is, for example, patterned by performing a photolithography and etching process.

With reference to FIG. 2D(1) to FIG. 2D(3), the liner layer 136 on one side wall of each of the trenches 128 is removed with use of the mask layer 138 as a mask. The liner layer 136 is, for example, removed by wet etching or dry etching. The liner layer 136 on one side wall of each of the trenches 128 is removed to expose the liner layer 134 and a portion of the insulating layer 110. After the mask layer 138 is removed, the insulating layer 110 exposed by the liner layer 134 is removed, so as to form the opening 142 that exposes the semiconductor substrate 100. The insulating layer 110 on the surface of the mask layer 126 is removed as well. Here, a method of removing the insulating layer 110 includes wet etching with use of the hydrofluoric acid containing solution as the etchant, for instance.

With reference to FIG. 2E(1) to FIG. 2E(3), the remaining liner layer 136 is removed. A method of removing the remaining liner layer 136, for example, is wet etching. The gap-filling material layer 132 is then removed by dry etching, for instance. A barrier layer 106b and a conductive layer 106a are sequentially formed in the trenches 128, and the trenches 128 are filled with the conductive layer 106a. A material of the conductive layer 106a includes a metallic material, such as tungsten, copper, aluminum, a copper-aluminum alloy, a silicon-copper-aluminum alloy, and so on. The barrier layer 106b, for instance, is Ti/TiN and Co/TiN. The Ti layer or the Co layer in the barrier layer 106b reacts with the semiconductor substrate 100 to form a silicide layer which acts as the bit line contacts 108. The embedded bit lines 106 are electrically connected to the semiconductor substrate 100 through the bit line contacts 108.

With reference to FIG. 2F(1) to FIG. 2F(3), a portion of the barrier layer 106b and a portion of the conductive layer 106a are removed, such that a surface of the barrier layer 106b and a surface of the conductive layer 106a are located between the bit line contacts 108 and the surface of the semiconductor substrate 100 to form the embedded bit lines 106. A method of removing the portion of the barrier layer 106b and the portion of the conductive layer 106a is, for example, wet etching or dry etching. An insulating layer 144 and an insulating layer 146 are then sequentially formed on the embedded bit lines 106. A material of the insulating layer 144 is silicon nitride, for instance. A material of the insulating layer 146 is, for instance, TEOS silicon oxide, BPTEOS silicon oxide, and BPSG formed by performing an APCVD process with use of TEOS as a reactive gas.

The cross-section taken along the line C-C' depicted in FIG. 1C is similar to what is shown in FIG. 2F(3), and therefore the subsequent processes are omitted in the drawings.

With reference to FIG. 2G(1) to FIG. 2G(2), after a portion of insulating layer 146 is removed, an inter-layer insulating layer 148 completely filling the trenches 128 is formed on the semiconductor substrate 100. A material of the inter-layer insulating layer 148 includes spin-on dielectric (SOD) materials, such as hydrogen silsesquioxnane (HSQ), methyl silsesquioxane (MSQ), or organic materials. Besides, the inter-layer insulating layer 148 is formed by performing a spin-coating process to form a SOD material layer and then performing a baking process on the SOD material layer, for example. A planarization process (e.g. a chemical mechanical polishing process or an etch-back process) is carried out to remove a portion of the SOD material layer and expose a surface of the mask layer 126.

Another mask layer 150 is formed on the semiconductor substrate 100. A material of the mask layer 150 is, for example, silicon nitride. A method of forming the mask layer 150 is, for example, chemical vapor deposition. The mask layer 150, the semiconductor substrate 100, and the inter-layer insulating layer 148 are patterned to form a plurality of trenches 152. A method of patterning the mask layer 150, the semiconductor substrate 100, and the inter-layer insulating layer 148 is, for instance, photolithography and etching. The trenches 152 are disposed in parallel in the semiconductor substrate 100 and extended in a row direction (X direction). The trenches 152 are located above the embedded bit lines 106. The semiconductor substrate 100 is divided by the trenches 152 and 128 into a plurality of semiconductor pillars.

With reference to FIG. 2H(1) to FIG. 2H(2), a gate dielectric layer 114 is formed on the semiconductor substrate 100. A material of the gate dielectric layer 114 is, for example, silicon oxide, and a method of forming the gate dielectric layer 114 is thermal oxidation or chemical vapor deposition, for example. The gate dielectric layer 114 is formed on surfaces of the semiconductor pillars. A barrier layer 112b and a conductive layer 112a are sequentially formed in the trenches 152, and the trenches 152 are filled with the conductive layer 112a. A material of the conductive layer 112a includes a metallic material, such as tungsten, copper, aluminum, a copper-aluminum alloy, a silicon-copper-aluminum alloy, and so on. A material of the barrier layer 112b, for instance, is TiN, Ti/TiN, Co/TiN, and so forth. A portion of the barrier layer 112b and a portion of the conductive layer 112a are removed, such that a surface of the barrier layer 112b and a surface of the conductive layer 112a are lower than the surface of the semiconductor substrate 100. A method of removing the portion of the barrier layer 112b and the portion of the conductive layer 112a is, for example, wet etching or dry etching.

With reference to FIG. 2I(1) to FIG. 2I(2), a gap-filling material layer 154 is formed in the trenches 152. A material of the gap-filling material layer 154 is, for instance, TEOS silicon oxide, BPTEOS silicon oxide, and BPSG formed by performing an APCVD process with use of TEOS as a reactive gas. A portion of the gap-filling material layer 154 is removed, such that a surface of the gap-filling material layer 154 is lower than top surfaces of the trenches 152. The gap-filling material layer 154 is, for example, removed by wet etching or dry etching. Liner layers 156a and 156b are formed on the side walls of each of the trenches 152. A material of the liner layers 156a and 156b is polysilicon, for example. The liner layers 156a and 156b, for example, are formed by forming a polysilicon layer and performing an anisotropic etching process, such that the liner layers 156a and 156b on the side walls of the trenches 152 are left. The liner layer 156a is located on the first side wall of each of the trenches 152, and the liner layer 156b is located on the second side wall of each of the trenches 152. The first side wall is opposite to the second side wall.

With reference to FIG. 2J(1) to FIG. 2J(2), another gap-filling material layer 158 is formed in the trenches 152. A material of the gap-filling material layer 158 is, for instance, TEOS silicon oxide, BPTEOS silicon oxide, and BPSG formed by performing an APCVD process with use of TEOS as a reactive gas. A portion of the gap-filling material layer 158 is removed, such that a surface of the gap-filling material layer 158 is lower than top surfaces of the trenches 152, and the liner layers 156a and 156b are exposed.

A liner layer 160 is formed on the semiconductor substrate 100. The trenches 152 are not completely filled with the liner layer 160. A material of the liner layer 160 is polysilicon, for example. A tilted ion implantation process 162 is performed to modify the liner layer 160 on the top surfaces of the trenches 152 and on one side wall of each of the trenches 152, so as to form the modified portion 160a. Ion implanted in the tilted ion implantation process 162 is, for example, oxygen ions, nitrogen ions, and so on.

With reference to FIG. 2K(1) to FIG. 2K(2), the liner layer 160 on one side wall of each of the trenches 152 is removed, and the modified portion 160a is left to form the patterned mask layer. The patterned mask layer has an opening that exposes the liner layer 156b on the side wall of each trench, and the liner layer 156b on the side wall of each trench is removed to form an opening 166. A material of the liner layer 160 is the same as the materials of the liner layers 156a and 156b. In the step of removing the liner layer 160 on the side wall of each of the trenches 152, the liner layer 156b on the side wall of each trench is removed simultaneously, so as to form the opening 166.

With reference to FIG. 2L(1) to FIG. 2L(2), the portion of the gap-filling material layer 158 and the portion of the gap-filling material layer 154 that are exposed by the opening 166 are removed, so as to form an opening 168. The patterned mask layer is then removed. A method of removing the portion of the gap-filling material layer 158 and the portion of the gap-filling material layer 154 that are exposed by the opening

166 is, for example, dry etching. Before the liner layer 156b on the side wall of each trench is removed to form the opening 166, the manufacturing method further includes forming a hard mask 170 that covers ends 102 of the embedded word lines, as indicated in FIG. 1B.

Figure 3:
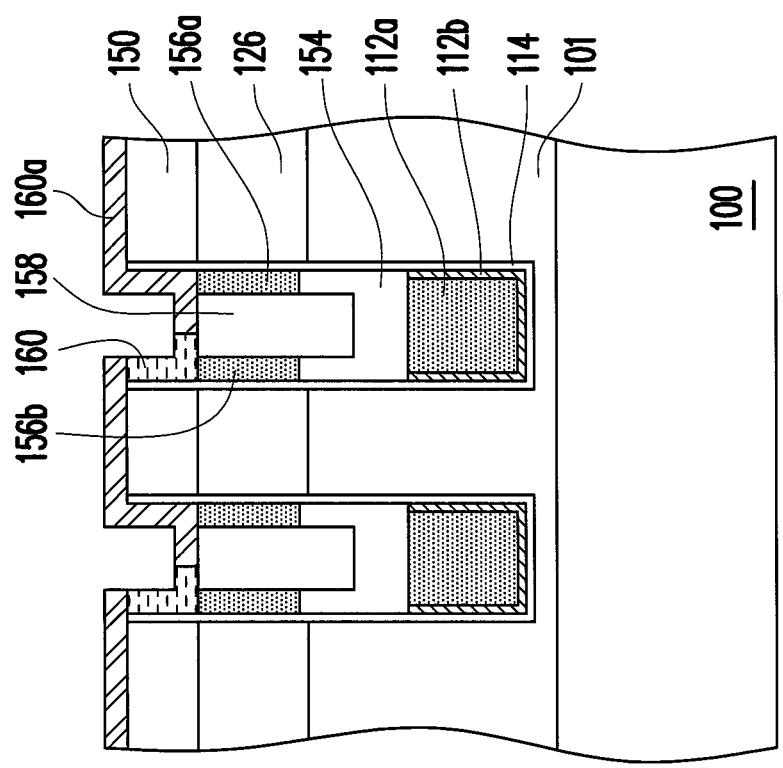
FIG. 3 is cross-sectional views illustrating ends of embedded word lines.

FIG. 3 is cross-sectional views illustrating ends of embedded word lines. FIG. 3 is a cross-sectional view taken along a line I-I' depicted in FIG. 1B. As indicated in FIG. 1B, FIG. 3, the peripheral regions of the semiconductor device array are not immersed in the etchant because the hard mask 170 covers the ends 102 of the embedded word lines, and the embedded word lines 112 are isolated by shallow trench isolation structures 101. As such, short circuit phenomenon or abnormal connection can be precluded.

With reference to FIG. 2M(1) to FIG. 2M(2), after the liner layer 156a on the side wall of each trench is removed, a portion of the barrier layer 112b and a portion of the conductive layer 112a are removed with use of the remaining gap-filling material layers 154 and 158 as the mask, so as to expose the insulating layer 146. Thereby, the embedded word lines 112 are formed at some sides (the first sides) of the trenches 152, and the back gate 124 is formed at the other sides (the second sides) of the trenches 152. An isolation structure 122 is formed between the embedded word lines 112 and the back gate 124. After the remaining gap-filling material layers 154 and 158 and the mask layer 150 are removed or kept, the cap layer 120 is formed on the isolation structure 122 and each of the embedded word lines 112. A material of the cap layer 120 is, for example, silicon oxide, silicon nitride, etc. The isolation structure 122 is an air gap or an insulating layer. In an embodiment of the invention, it is likely not to form the back gate 124 on the other sides of the trenches 152.

Second Embodiment

FIG. 4A(1)~FIG. 4G(1) are cross-sectional views illustrating a manufacturing process depicted in FIG. 1G taken along a line A-A'. FIG. 4A(2)~FIG. 4G(2) are cross-sectional views illustrating a manufacturing process depicted in FIG. 1G taken along a line B-B'. FIG. 4A(1) to FIG. 4G(1) follow FIG. 2F(1); FIG. 4A(2) to FIG. 4G(2) follow FIG. 2F(2).

With reference to FIG. 4A(1) to FIG. 4A(2), a sacrificial layer 148a is formed on the semiconductor substrate 100, and the trenches 128 are filled with the sacrificial layer 148a. A material of the sacrificial layer 148a includes SOD materials, such as HSQ, MSQ, or organic materials. Besides, the sacrificial layer 148a is formed by performing a spin-coating process to form a SOD material layer and then performing a baking process on the SOD material layer, for example. A planarization process (e.g. a chemical mechanical polishing process or an etch-back process) is carried out to remove a portion of the SOD material layer and expose a surface of the mask layer 126.

Another mask layer 150 is formed on the semiconductor substrate 100. A material of the mask layer 150 is, for example, silicon nitride. A method of forming the mask layer 150 is, for example, chemical vapor deposition. The mask layer 150, the semiconductor substrate 100, and the inter-layer insulating layer 148 are patterned to form a plurality of trenches 152. A method of patterning the mask layer 150, the semiconductor substrate 100, and the inter-layer insulating layer 148 is, for instance, photolithography and etching. The trenches 152 are disposed in parallel in the semiconductor substrate 100 and extended in a row direction (X direction). The trenches 152 are located above the embedded bit lines 106. The semiconductor substrate 100 is divided by the trenches 152 and 128 into a plurality of semiconductor pillars.

With reference to FIG. 4B(1) to FIG. 4B(2), after the mask layer 150 is removed or kept, a pad layer 180 is formed on the semiconductor substrate 100. Here, a material of the pad layer 180 is, for example, silicon oxide, and a method of forming the pad layer 180 is, for example, thermal oxidation or chemical vapor deposition. Liner layers 172a and 172b are formed on the side walls of each of the trenches 152. The liner layer 172a is located on the first side wall of each of the trenches 152, and the liner layer 172b is located on the second side wall of each of the trenches 152. The first side wall is opposite to the second side wall. A material of the liner layers 172a and 172b are polysilicon, for example. The liner layers 172a and 172b are formed by forming a polysilicon layer and performing an anisotropic etching process, such that the liner layers 172a and 172b on the side walls of each of the trenches 152 are left. A gap-filling material layer 174 is formed in the trenches 152. A material of the gap-filling material layer 174 is, for instance, TEOS silicon oxide, BPTEOS silicon oxide, and BPSG formed by performing an APCVD process with use of TEOS as a reactive gas. A portion of the gap-filling material layer 174 is removed, such that a surface of the gap-filling material layer 174 is lower than the top surfaces of the trenches 152. The portion of the gap-filling material layer 174 is, for example, removed by wet etching or dry etching.

With reference FIG. 4C(1) to FIG. 4C(2), a portion of the liner layer 172a and a portion of the liner layer 172b are removed, such that surfaces of the liner layers 172a and 172b are lower than the top surface of the gap-filing material layer 174. A liner layer 176 is formed on the semiconductor substrate 100, and the trenches 152 are not completely filled with the liner layer 176. A material of the liner layer 176 is polysilicon, for example. A tilted ion implantation process 178 is performed to modify the liner layer 176 on the top surfaces of the trenches 152 and on one side wall of each of the trenches 152, so as to form the modified portion 176a. Ion implanted in the tilted ion implantation process 178 is, for example, oxygen ions, nitrogen ions, and so on.

With reference to FIG. 4D(1) to FIG. 4D(2), the liner layer 176 on one side wall of each of the trenches 152 is removed, and the modified portion 176a is left to form the patterned mask layer. The liner layer 172a on the side wall of each trench is removed with use of the patterned mask layer as the mask. A material of the liner layer 176 is the same as a material of the liner layer 172. In the step of removing the liner layer 176 on the side wall of each trench, the liner layer 172a on the side wall of each trench is removed simultaneously. The gap-filling material layer 174 is then removed. Before the liner layer 172a on the side wall of each trench is removed, the manufacturing method further includes forming the hard mask 170 that covers ends 102 of the embedded word lines (as shown in FIG. 1B). The peripheral regions of the semiconductor device array are not immersed in the etchant because the hard mask 170 covers the ends 102 of the embedded word lines. As such, short circuit phenomenon or abnormal connection can be precluded.

With reference to FIG. 4E(1) to FIG. 4E(2), the patterned mask layer (the modified portion 176a), the sacrificial layer 148a, and portion of the pad layer 180 are removed, and then a gate dielectric layer 114 is formed on the semiconductor substrate 100. A material of the gate dielectric layer 114 is, for example, silicon oxide, and a method of forming the gate dielectric layer 114 is thermal oxidation or chemical vapor deposition, for example. The gate dielectric layer 114 is formed on surfaces of the semiconductor pillars. A barrier layer 112b and a conductive layer 112a are sequentially formed on the semiconductor substrate 100, and the trenches 152 are filled with the conductive layer 112a. A material of the conductive layer 112a includes a metallic material, such as tungsten, copper, aluminum, a copper-aluminum alloy, a silicon-copper-aluminum alloy, and so on. A material of the barrier layer 112b, for instance, is TiN, Ti/TiN, Co/TiN, and so forth.

With reference to FIG. 4F(1) to FIG. 4F(2), a portion of the barrier layer 112b and a portion of the conductive layer 112a are removed, such that a surface of the barrier layer 112b and a surface of the conductive layer 112a are lower than a surface of the liner layer 172b, and that each embedded word line 112 is formed at one side of each of the trenches 152.

An inter-layer insulating layer 148 is formed in the trenches 152. A material of the inter-layer insulating layer 148 is, for instance, TEOS silicon oxide, BPTEOS silicon oxide, and BPSG formed by performing an APCVD process with use of TEOS as a reactive gas. A portion of the inter-layer insulating layer 148 is removed, such that a surface of the inter-layer insulating layer 148 is lower than the top surface of the liner layer 172b. When the inter-layer insulating layer 148 is removed, a portion of the gate dielectric layer 114 is removed as well, so as to expose the liner layer 172b.

With reference to FIG. 4G(1) to FIG. 4G(2), the liner layer 172b on the side wall of each trench is removed, so as to form the isolation structure 122. A cap layer 120 is then formed on the isolation structure 122 and each of the embedded word lines 112. A material of the cap layer 120 is, for example, silicon oxide, silicon nitride, etc. The isolation structure 122 is an air gap or an insulating layer.

Third Embodiment

FIG. 5A(1)~FIG. 5H(1) are cross-sectional views illustrating a manufacturing process depicted in FIG. 1G taken along the line A-A'. FIG. 5A(2)~FIG. 5H(2) are cross-sectional views illustrating a manufacturing process depicted in FIG. 1G taken along the line B-B'. FIG. 5A(1) to FIG. 5H (1) follow FIG. 2F(1); FIG. 5A(2) to FIG. 5H(2) follow FIG. 2F(2).

With reference to FIG. 5A(1) to FIG. 5A(2), an inter-layer insulating layer 148 completely filling the trenches 128 is formed on the semiconductor substrate 100. A material of the inter-layer insulating layer 148 includes SOD materials, such as HSQ, MSQ, or organic materials. Besides, the inter-layer insulating layer 148 is formed by performing a spin-coating process to form a SOD material layer and then performing a baking process on the SOD material layer, for example. A planarization process (e.g. a chemical mechanical polishing process or an etch-back process) is carried out to remove a portion of the SOD material layer and expose a surface of the mask layer 126.

Another mask layer 150 is formed on the semiconductor substrate 100. A material of the mask layer 150 is, for example, silicon nitride. A method of forming the mask layer 150 is, for example, chemical vapor deposition. The mask layer 150, the semiconductor substrate 100, and the inter-layer insulating layer 148 are patterned to form a plurality of trenches 152. A method of patterning the mask layer 150, the semiconductor substrate 100, and the inter-layer insulating layer 148 is, for instance, photolithography and etching. The trenches 152 are disposed in parallel in the semiconductor substrate 100 and extended in a row direction (X direction). The trenches 152 are located above the embedded bit lines 106. The semiconductor substrate 100 is divided by the trenches 152 and 128 into a plurality of semiconductor pillars.

A gate dielectric layer 114 is formed on the semiconductor substrate 100. A material of the gate dielectric layer 114 is, for example, silicon oxide, and a method of forming the gate dielectric layer 114 is thermal oxidation or chemical vapor deposition, for example. The gate dielectric layer 114 is formed on surfaces of the semiconductor pillars. A gap-filling material layer 182 is formed in the trenches 152. A material of the gap-filling material layer 182 is, for instance, TEOS silicon oxide, BPTEOS silicon oxide, and BPSG formed by performing an APCVD process with use of TEOS as a reactive gas. A portion of the gap-filling material layer 182 is removed, such that a surface of the gap-filling material layer 182 is lower than the top surfaces of the trenches 152.

With reference to FIG. 5B(1) to FIG. 5B(2), a pad layer 184 is formed on the semiconductor substrate 100. A material of the pad layer 184 and a material of the gate dielectric layer 114 have different etching selectivity. Here, a material of the pad layer 184 is, for example, silicon nitride, and a method of forming the pad layer 184 is, for example, nitridation or chemical vapor deposition. An anisotropic etching process is then carried out, and the liner layer 184 on the side wall of each of the trenches 152 is left. A portion of the gap-filling material layer 182 is removed, such that a distance between a surface of the gap-filling material layer 182 and the top surfaces of the trenches 152 increases.

Liner layers 186a and 186b are formed on a surface of the pad layer 184 exposed by the gap-filling material layer 182. A material of the liner layers 186a and 186b and a material of the pad layer 184 have different etching selectivity. The material of the liner layers 186a and 186b is polysilicon, for example, and a method of forming the liner layers 186a and 186b is, for instance, chemical vapor deposition. An anisotropic etching process is then carried out, and the liner layers 186a and 186b on the side wall of each of the trenches 152 are left.

A gap-filling material layer 188 is formed in the trenches 152. A material of the gap-filling material layer 188 is, for instance, TEOS silicon oxide, BPTEOS silicon oxide, and BPSG formed by performing an APCVD process with use of TEOS as a reactive gas. A portion of the gap-filling material layer 188 is removed, such that a surface of the gap-filling material layer 188 is lower than the top surfaces of the trenches 152.

With reference FIG. 5C(1) to FIG. 5C(2), a portion of the liner layer 186 is removed, such that a surface of the liner layer 186 is lower than a top surface of the gap-filing material layer 188. A liner layer 190 is formed on the semiconductor substrate 100, and the trenches 152 are not completely filled with the liner layer 190. A material of the liner layer 190 is polysilicon, for example. A tilted ion implantation process 192 is performed to modify the liner layer 190 on the top surfaces of the trenches 152 and on one side wall of each of the trenches 152, so as to form the modified portion 190a. Ion implanted in the tilted ion implantation process 192 is, for example, oxygen ions, nitrogen ions, and so on.

With reference to FIG. 5D(1) to FIG. 5D(2), the liner layer 190 on one side wall of each of the trenches 152 is removed, and the modified portion 190a is left to form the patterned mask layer. The liner layer 186a on the side wall of each trench is removed with use of the patterned mask layer as the mask. A material of the liner layer 190 is the same as a material of the liner layer 186a. In the step of removing the liner layer 190 on the side wall of each trench, the liner layer 186a on the side wall of each trench is removed simultaneously. A portion of the gap-filling material layer 182 and a portion of the gate dielectric layer 114 are removed with use of the patterned mask layer and the pad layer 184 as the mask, so as to form an opening 194. Before the liner layer 190 on the side wall of each trench is removed, the manufacturing method further includes forming the hard mask 170 that covers ends 102 of the embedded word lines (as shown in FIG. 1B). The peripheral regions of the semiconductor device array are not immersed in the etchant because the hard mask 170 covers the ends 102 of the embedded word lines. As such, short circuit phenomenon or abnormal connection can be precluded.

With reference to FIG. 5E(1) to FIG. 5E(2), the patterned mask layer (the modified portion 190a) and the gap-filling material layer 188 are removed, and a portion of the inter-layer insulating layer 148 is then removed to form an opening 196.

With reference to FIG. 5F(1) to FIG. 5F(2), the pad layer 184 on one side of each of the trenches 152 is removed, and another gate dielectric layer 114 is then formed on the semiconductor substrate 100. A material of the gate dielectric layer 114a is, for example, silicon oxide, and a method of forming the gate dielectric layer 114a is thermal oxidation or chemical vapor deposition, for example. The gate dielectric layer 114a is formed on surfaces of the semiconductor pillars. A barrier layer 112b and a conductive layer 112a are sequentially formed on the semiconductor substrate 100, and the trenches 152 and the opening 196 are filled with the conductive layer 112a. A material of the conductive layer 112a includes a metallic material, such as tungsten, copper, aluminum, a copper-aluminum alloy, a silicon-copper-aluminum alloy, and so on. A material of the barrier layer 112b, for instance, is TiN, Ti/TiN, Co/TiN, and so forth. A portion of the barrier layer 112b and a portion of the conductive layer 112a are removed, such that a surface of the barrier layer 112b and a surface of the conductive layer 112a are lower than a surface of the liner layer 186b, and that the embedded word lines 112 are formed at one side of each of the trenches 152.

With reference to FIG. 5G(1) to FIG. 5G(2), an insulating layer 198 is formed in the trenches 152. A material of the insulating layer 198 is, for instance, TEOS silicon oxide, BPTEOS silicon oxide, and BPSG formed by performing an APCVD process with use of TEOS as a reactive gas. A portion of the insulating layer 198 is removed, such that a surface of the insulating layer 198 is lower than the top surface of the liner layer 186b. When the insulating layer 198 is removed, a portion of the gate dielectric layer 114a is removed as well, so as to expose the liner layer 186b.

With reference to FIG. 5H(1) to FIG. 5H(2), the liner layer 186b on the side wall of each trench is removed, so as to form the isolation structure 122. A cap layer 120 is then formed on the isolation structure 122 and the insulating layer 198. A material of the cap layer 120 is, for example, silicon oxide, silicon nitride, etc. The isolation structure 122 is an air gap or an insulating layer.

Fourth Embodiment

FIG. 6A(1)~FIG. 6G(1) are cross-sectional views illustrating a manufacturing process depicted in FIG. 1H taken along a line A-A'. FIG. 6A(2)~FIG. 6G(2) are cross-sectional views illustrating a manufacturing process depicted in FIG. 1H taken along a line B-B'. FIG. 6A(1) to FIG. 6G(1) follow FIG. 2F(1); FIG. 6A(2) to FIG. 6G(2) follow FIG. 2F(2).

With reference to FIG. 6A(1) to FIG. 6A(2), a sacrificial layer 148a is formed on the semiconductor substrate 100. A material of the sacrificial layer 148a includes SOD materials, such as HSQ, MSQ, or organic materials. Besides, the sacrificial layer 148a is formed by performing a spin-coating process to form a SOD material layer and then performing a baking process on the SOD material layer, for example. An etch-back process is performed to remove a portion of the SOD material layer, such that a surface of the SOD material layer is lower than the surface of the semiconductor substrate 100. An inter-layer insulating layer 148 is formed on the sacrificial layer 148a, and the trenches 128 are filled with the inter-layer insulating layer 148. A material of the inter-layer insulating layer 148 is, for instance, TEOS silicon oxide, BPTEOS silicon oxide, and BPSG formed by performing an APCVD process with use of TEOS as a reactive gas.

Another mask layer 150 is formed on the semiconductor substrate 100. A material of the mask layer 150 is, for example, silicon nitride. A method of forming the mask layer 150 is, for example, chemical vapor deposition. The mask layer 150, the semiconductor substrate 100, the inter-layer insulating layer 148, and the sacrificial layer 148a are patterned to form a plurality of trenches 152. A method of patterning the mask layer 150, the semiconductor substrate 100, the inter-layer insulating layer 148, and the sacrificial layer 148a is, for instance, photolithography and etching. The trenches 152 are disposed in parallel in the semiconductor substrate 100 and extended in a row direction (X direction). The trenches 152 are located above the embedded bit lines 106. The semiconductor substrate 100 is divided by the trenches 152 and 128 into a plurality of semiconductor pillars.

With reference to FIG. 6B(1) to FIG. 6B(2), the sacrificial layer 148a is removed, and trenches 152a are formed below the inter-layer insulating layer 148 and above the embedded bit lines. A gate dielectric layer 114 is formed on the semiconductor substrate 100. A material of the gate dielectric layer 114 is, for example, silicon oxide, and a method of forming the gate dielectric layer 114 is thermal oxidation or chemical vapor deposition, for example. The gate dielectric layer 114 is formed on surfaces of the semiconductor pillars. A barrier layer 112b and a conductive layer 112a are sequentially formed in the trenches 152 and 152a, and the trenches 152 and 152a are filled with the conductive layer 112a. A material of the conductive layer 112a includes a metallic material, such as tungsten, copper, aluminum, a copper-aluminum alloy, a silicon-copper-aluminum alloy, and so on. A material of the barrier layer 112b, for instance, is TiN, Ti/TiN, Co/TiN, and so forth. A portion of the barrier layer 112b and a portion of the conductive layer 112a are removed, such that a surface of the barrier layer 112b and a surface of the conductive layer 112a are lower than the surface of the semiconductor substrate 100 and slightly higher than a bottom surface of the inter-layer insulating layer 148. A method of removing the portion of the barrier layer 112b and the portion of the conductive layer 112a is, for example, wet etching or dry etching.

With reference to FIG. 6C(1) to FIG. 6C(2), a gap-filling material layer 154 is formed in the trenches 152. A material of the gap-filling material layer 154 is, for instance, TEOS silicon oxide, BPTEOS silicon oxide, and BPSG formed by performing an APCVD process with use of TEOS as a reactive gas. A portion of the gap-filling material layer 154 is removed, such that a surface of the gap-filling material layer 154 is lower than top surfaces of the trenches 152. The liner layers 156a and 156b are formed on the side walls of each of the trenches 152. A material of the liner layers 156a and 156b are polysilicon, for example. The liner layers 156a and 156b are, for example, formed by forming a polysilicon layer and performing an anisotropic etching process, such that the liner layers 156a and 156b on the side walls of each of the trenches 152 are left.

With reference to FIG. 6D(1) to FIG. 6D(2), another gap-filling material layer 158 is formed in the trenches 152. A material of the gap-filling material layer 158 is, for instance, TEOS silicon oxide, BPTEOS silicon oxide, and BPSG formed by performing an APCVD process with use of TEOS as a reactive gas. A portion of the gap-filling material layer 158 is removed, such that a surface of the gap-filling material layer 158 is lower than the top surfaces of the trenches 152, and thereby the liner layers 156a and 156b are exposed.

A liner layer 160 is formed on the semiconductor substrate 100, and the trenches 152 are not completely filled with the liner layer 160. A material of the liner layer 160 is polysilicon, for example. A tilted ion implantation process 162 is performed to modify the liner layer 160 on the top surfaces of the trenches 152 and on one side wall of each of the trenches 152, so as to form the modified portion 160a. Ion implanted in the tilted ion implantation process 162 is, for example, oxygen ions, nitrogen ions, and so on.

With reference to FIG. 6E(1) to FIG. 6E(2), the liner layer 160 on one side wall of each of the trenches 152 is removed, and the modified portion 160a is left to form the patterned mask layer. The patterned mask layer has an opening 164 that exposes the liner layer 156b on the side wall of each trench. The liner layer 156b on the side wall of each trench is removed to form the opening 166. A material of the liner layer 160 is the same as the material of the liner layer 156. In the step of removing the liner layer 160 on the side wall of each trench, the liner layer 156b on the side wall of each trench is removed simultaneously, so as to form an opening 166.

With reference to FIG. 6F(1) to FIG. 6F(2), the portion of the gap-filling material layer 158 and the portion of the gap-filling material layer 154 that are exposed by the opening 166 are removed, so as to form an opening 168. The patterned mask layer is then removed. A method of removing the portion of the gap-filling material layer 158 and the portion of the gap-filling material layer 154 that are exposed by the opening 166 is, for example, dry etching. Before the liner layer 156b on the side wall of each trench is removed to form the opening 168, the manufacturing method further includes forming a hard mask 170 that covers ends 102 of the embedded word lines, as indicated in FIG. 1B.

FIG. 3 is cross-sectional views illustrating ends of embedded word lines. As indicated in FIG. 1B, FIG. 3, the peripheral regions of the semiconductor device array are not immersed in the etchant because the hard mask 170 covers the ends 102 of the embedded word lines. As such, short circuit phenomenon or abnormal connection can be precluded.

With reference to FIG. 6G(1) to FIG. 6G(2), after the liner layer 156a on the side wall of each trench is removed, a portion of the barrier layer 112b and a portion of the conductive layer 112a are removed with use of the remaining gap-filling material layers 154 and 158 as the mask, so as to expose the insulating layer 146 and form each embedded word line 112 at one side of each of the trenches 152. An isolation structure 122 is formed between the embedded word lines 112. After the remaining gap-filling material layers 154 and 158 and the mask layer 150 are removed or keep, a cap layer 120 is formed on the isolation structure 122 and each of the embedded word lines 112. The cap layer 120, for example, is made of silicon oxide, silicon nitride, etc. The isolation structure 122 is an air gap or an insulating layer. In an embodiment of the invention, it is likely not to form the back gate 124 on the other sides of the trenches 152.

According to the above-mentioned embodiments, in the steps of forming the embedded word lines, the liner layers 160, 176, 190 are formed and then modified by performing a tilted ion implantation process, and the unmodified liner layers are removed to form the patterned mask layer. Since no photolithography process is performed, openings with reduced size can be formed.

The peripheral regions of the semiconductor device array are not immersed in the etchant because the hard mask 170 covers the ends 102 of the embedded word lines. As such, short circuit phenomenon or abnormal connection can be precluded.

Based on the above, in the vertical channel transistor array and the manufacturing method thereof as described in the invention, only one of the embedded word lines is disposed on the semiconductor pillars in one row, and therefore device dimension can be reduced. Besides, each of the embedded word lines selectively has a plurality of extending portions. Each of the extending portions is disposed between two adjacent semiconductor pillars in the same row, so as to increase the channel area of the device and effectively prevent short channel effects. Thereby, device performance is improved.

The embedded word lines and the back gate are respectively disposed on the two opposite sides of the semiconductor pillars. The back gate can protect the semiconductor pillars from being etched during the etching process. Meanwhile, during operation of the semiconductor device of the invention, the adjacent embedded word lines are not interfered with each other, so as to improve device performance.

In addition, the isolation structure 122 is disposed between two adjacent embedded word lines, so as to isolate the adjacent embedded word lines.

Moreover, in the steps of forming the embedded word lines, the liner layers are formed and then modified by performing a tilted ion implantation process, and the unmodified liner layers are removed to form the patterned mask layer. Since no photolithography process is performed, openings with reduced size can be formed.

The peripheral regions of the semiconductor device array are not immersed in the etchant because the hard mask covers the ends of the embedded word lines. As such, short circuit phenomenon or abnormal connection can be precluded.

Although the invention has been disclosed above by the embodiments, they are not intended to limit the invention. Anybody skilled in the art can make some modifications and alteration without departing from the spirit and scope of the invention. Therefore, the protecting range of the invention falls in the appended claims.

What is claimed is:

1. A vertical channel transistor array, comprising:
   a plurality of semiconductor pillars disposed in a semiconductor substrate and arranged in a column and row array, an active area of a vertical channel transistor being defined by the semiconductor pillars;
   a plurality of embedded bit lines disposed in parallel in the semiconductor substrate and extended in a column direction, the embedded bit lines being electrically connected to the semiconductor pillars in the same column; and
   a plurality of embedded word lines disposed in parallel above the embedded bit lines and extended in a row direction, the embedded word lines and the semiconductor pillars in the same row being connected and spaced by a gate dielectric layer,
   wherein each of the embedded word lines is connected to first sides of the semiconductor pillars in the same row, not connected to second sides of the semiconductor pillars in the same row, and the first sides are opposite to the second sides; and only one embedded word lines is correspondingly connected to the semiconductor pillars arranged in one row.

2. The vertical channel transistor array as claimed in claim 1, wherein an isolation structure is disposed between two of the embedded word lines adjacent to each other.

3. The vertical channel transistor array as claimed in claim 2, wherein a cap layer is disposed on the isolation structure and each of the embedded word lines.

4. The vertical channel transistor array as claimed in claim 2, wherein the isolation structure is an air gap or an insulating layer.

5. The vertical channel transistor array as claimed in claim 1, further comprising a protection layer disposed at the second sides of the semiconductor pillars in the same row.

6. The vertical channel transistor array as claimed in claim 1, wherein each of the embedded word lines comprises:
   a conductive layer; and
   a barrier layer disposed between the conductive layer and the semiconductor pillars.

7. The vertical channel transistor array as claimed in claim 1, wherein each of the embedded word lines comprises a plurality of extending portions, and each of the extending portions is disposed between two of the semiconductor pillars adjacent to each other in the same row.

8. The vertical channel transistor array as claimed in claim 7, wherein each of the embedded word lines comprises:
   a conductive layer; and
   a barrier layer disposed between the conductive layer and the semiconductor pillars.

9. The vertical channel transistor array as claimed in claim 8, wherein the barrier layer covers the semiconductor pillars.

* * * * *